United States Patent
Haynes et al.

[11] Patent Number: 6,054,809
[45] Date of Patent: Apr. 25, 2000

[54] ELECTROLUMINESCENT LAMP DESIGNS

[75] Inventors: Bryan D. Haynes, Pacifica; Michael C. Feldman, San Carlos; Matthew C. Wilkinson, Santa Cruz, all of Calif.

[73] Assignee: Add-Vision, Inc., Pacifica, Calif.

[21] Appl. No.: 08/910,724

[22] Filed: Aug. 13, 1997

Related U.S. Application Data

[60] Provisional application No. 60/023,923, Aug. 14, 1996, provisional application No. 60/031,715, Nov. 22, 1996, provisional application No. 60/040,610, Mar. 17, 1997, and provisional application No. 60/043,784, Apr. 11, 1997.

[51] Int. Cl.$^7$ ...................................................... H05B 33/26
[52] U.S. Cl. ............................ 313/505; 313/506; 313/509
[58] Field of Search ..................................... 313/498, 505, 313/506, 509; 445/24

[56] References Cited

U.S. PATENT DOCUMENTS

| | | | |
|---|---|---|---|
| 2,877,371 | 3/1959 | Orthuber et al. | 313/108 |
| 2,883,582 | 4/1959 | Hanlet | 315/169 |
| 2,928,974 | 3/1960 | Mash | 313/108 |

(List continued on next page.)

FOREIGN PATENT DOCUMENTS

| | | |
|---|---|---|
| 2265193 | 10/1990 | Japan . |
| 3233891 | 10/1991 | Japan . |
| 4133286 | 5/1992 | Japan . |
| 5003079 | 1/1993 | Japan . |
| 5205873 | 8/1993 | Japan . |
| 5205876 | 8/1993 | Japan . |
| 6005369 | 1/1994 | Japan . |
| 6151063 | 5/1994 | Japan . |
| 6295788 | 10/1994 | Japan . |
| 7114350 | 5/1995 | Japan . |
| WO 97/04398 | 7/1996 | WIPO . |

(List continued on next page.)

OTHER PUBLICATIONS

McGraw–Hill Encyclopedia of Science & Technology, vol. 6, pp. 139, 1987.
"A History and Technical Discussion of Electroluminescent Lamps", E1 History/Technical Discussion, 9 pages.
Durel 3 Electroluminescent System, Product Selection Guide, Durel Corporation, 24 pages (1995).
DuPont, "Blendable Polymer Thick Films" (data sheets).
Har Hotzvim, "Blinking Wires and Signs in Various Colors Easily Installed and Reused", ELAM.
Du Pont Electronics, Material Safety Data Sheet, 5007 Membrane Switch Composition (Dec. 21, 1994).
Du Pont Electronics, Material Safety Data Sheet, 5018 Membrane Switch Composition (Aug. 27, 1996).
Du Pont Electronics, 5025 Silver Conductor Thick Film Composition Data Sheet.
Du Pont Electronics, Material Safety Data Sheet, 5025 Membrane Switch Composition (Dec. 21, 1994).

(List continued on next page.)

*Primary Examiner*—Kenneth J. Ramsey
*Attorney, Agent, or Firm*—Pillsbury Madison & Sutro LLP

[57] ABSTRACT

Electroluminescent lamp designs and methods of fabricating electroluminescent lamps. Lamp designs provide laminar style lamps that include an electrically conductive layer with one or more openings therethrough separated by conductive elements. The openings preferably have a minimum edge to edge distance of less than about 0.005 inches and the conductive elements have a width of less than about 0.002 inches. Lamp designs also include "iso-planar" lamps that contain an electrically conductive layer with one or more channels separating the layer into two or more electrically conductive elements and an electroluminescent material disposed between the electrically conductive elements. The laminar style lamps and iso-planar lamps may be fabricated using printing techniques and the iso-planar lamps may also be fabricated using etching techniques. Both printed laminar and iso-planar lamps may be permanently reshaped using sheet forming techniques such as vacuum-forming or drape-forming.

42 Claims, 16 Drawing Sheets

U.S. PATENT DOCUMENTS

| | | | |
|---|---|---|---|
| 2,932,746 | 4/1960 | Jay, Jr. | 250/213 |
| 2,951,970 | 9/1960 | Matarese | 315/169 |
| 2,958,009 | 10/1960 | Bowerman, Jr. | 315/169 |
| 2,991,384 | 7/1961 | Goldberg | 313/498 |
| 3,042,834 | 7/1962 | Nicoll | 315/169 |
| 3,047,052 | 7/1962 | Fridrich | 156/580 |
| 3,052,812 | 9/1962 | Dow | 313/108 |
| 3,069,579 | 12/1962 | Berg et al. | 313/108 |
| 3,073,992 | 1/1963 | Wolfe | 315/169 |
| 3,246,204 | 4/1966 | Katona | 315/313 |
| 3,252,845 | 5/1966 | Schindler et al. | 156/67 |
| 3,278,784 | 10/1966 | Masaharu | 313/108 |
| 3,388,277 | 6/1968 | Thornton, Jr. | 313/108 |
| 3,525,091 | 8/1970 | Lally | 340/324 |
| 3,548,214 | 12/1970 | Brown, Sr. | 250/213 |
| 3,571,647 | 3/1971 | Robinson | 313/108 |
| 3,571,654 | 3/1971 | Suzuki et al. | 315/5 |
| 3,575,634 | 4/1971 | Kohashi | 315/169 |
| 3,634,714 | 1/1972 | Anderson et al. | 313/108 A |
| 3,803,437 | 4/1974 | Robinson | 313/108 R |
| 3,807,036 | 4/1974 | Fischer | 29/577 |
| 3,819,973 | 6/1974 | Hosford | 313/498 |
| 4,020,389 | 4/1977 | Dickson et al. | 315/246 |
| 4,066,925 | 1/1978 | Dickson | 313/503 |
| 4,416,933 | 11/1983 | Antson et al. | 428/216 |
| 4,534,743 | 8/1985 | D'Onofrio et al. | 445/24 |
| 4,613,793 | 9/1986 | Panicker et al. | 315/169 |
| 4,665,342 | 5/1987 | Topp et al. | 313/509 |
| 4,670,690 | 6/1987 | Ketchpel | 313/505 |
| 4,689,522 | 8/1987 | Robertson | 313/506 |
| 4,717,859 | 1/1988 | Sohn | 313/505 |
| 4,814,668 | 3/1989 | Tohda et al. | 313/506 |
| 4,902,567 | 2/1990 | Eilerstsen et al. | 428/328 |
| 5,045,755 | 9/1991 | Appelberg | 313/498 |
| 5,051,654 | 9/1991 | Nativi et al. | 313/506 |
| 5,053,675 | 10/1991 | Thioulouse | 313/505 |
| 5,172,937 | 12/1992 | Sachetti | 283/81 |
| 5,184,969 | 2/1993 | Sharpless et al. | 445/24 |
| 5,266,865 | 11/1993 | Haizumi et al. | 313/506 |
| 5,276,382 | 1/1994 | Stocker et al. | 313/506 |
| 5,309,060 | 5/1994 | Sharpless et al. | 313/511 |
| 5,381,310 | 1/1995 | Brotz | 362/32 |
| 5,400,047 | 3/1995 | Beesely | 313/503 |
| 5,410,217 | 4/1995 | LaPointe | 313/509 |
| 5,469,019 | 11/1995 | Mori | 313/509 |
| 5,485,355 | 1/1996 | Voskoboinik et al. | 362/84 |
| 5,491,377 | 2/1996 | Janusauskas | 313/506 |
| 5,496,427 | 3/1996 | Gustafson et al. | 156/67 |
| 5,508,585 | 4/1996 | Butt | 313/509 |
| 5,565,733 | 10/1996 | Krafcik et al. | 313/506 |
| 5,573,807 | 11/1996 | LaPointe | 427/66 |
| 5,594,989 | 1/1997 | Greve | 29/896.4 |
| 5,844,362 | 12/1998 | Tanabe et al. | 313/506 |
| 5,856,031 | 1/1999 | Burrows | 313/506 |

FOREIGN PATENT DOCUMENTS

| | | |
|---|---|---|
| WO 98/03896 | 8/1996 | WIPO . |
| WO 98/19208 | 10/1997 | WIPO . |
| WO 98/41898 | 3/1998 | WIPO . |
| WO 98/41899 | 3/1998 | WIPO . |
| WO 99/10767 | 8/1998 | WIPO . |
| WO 99/10768 | 8/1998 | WIPO . |
| WO 99/10769 | 8/1998 | WIPO . |

OTHER PUBLICATIONS

Du Pont Electronics, Material Safety Data Sheet, 5928 Thinner (Dec. 23, 1994).

Du Pont Electronic Materials, Technical Data, 7141 Electroluminescent Yellow–Green Phosphor.

Du Pont Electronic Materials, Technical Data, 7144 Electroluminescent Carbon Conductor.

Du Pont Electronics, Material Safety Data Sheet, 7144 Electrode Composition (Aug. 7, 1996).

Du Pont Electronic Materials, Technical Data, 7145 Electroluminescent Silver Conductor.

Du Pont Electronics, Material Safety Data Sheet, 7145 Electrode Composition (Oct. 27, 1995).

Du Pont Electronic Materials, Technical Data, 7148 Electroluminescent Dielectric Insulator.

Du Pont Electronic Materials, Technical Data, 7151 Electroluminescent Green–Blue Phosphor.

Du Pont Electronics, Material Safety Data Sheet, 7151 Membrane Switch Dielectric (Apr. 16, 1996).

Du Pont Electronics, Material Safety Data Sheet, 7153 Dielectric Composition (Oct. 21, 1996).

Du Pont Electronic Materials, Technical Data, 7155 Electroluminescent Medium.

Du Pont Electronics, Material Safety Data Sheet, 7155 Membrane Switch Composition (Jul. 12, 1996).

Du Pont Electronic Materials, Technical Data, 7160 Electroluminescent Indium Tin Oxide Conductor Du Pont Electronics, Material Safety Data Sheet, 8210 Thinner (Dec. 27, 1994).

Du Pont Electronics, Material Safety Data Sheet, V009 Conductive Powder (Jan. 12, 1995).

Du Pont Chemicals, Material Safety Data Sheet, "Ti–Pure" Titanium Dioxide Pigment (Dry and Slurry) (Nov. 23, 1995).

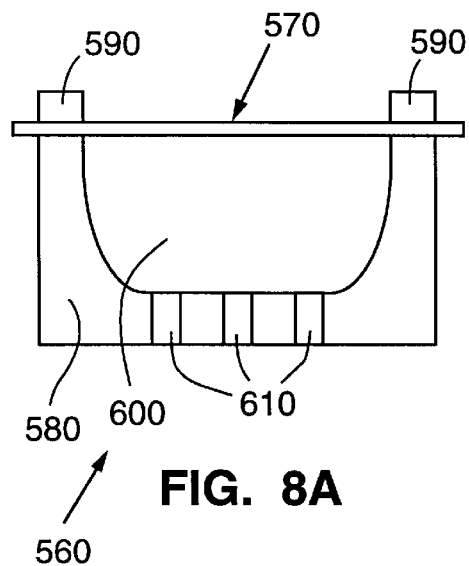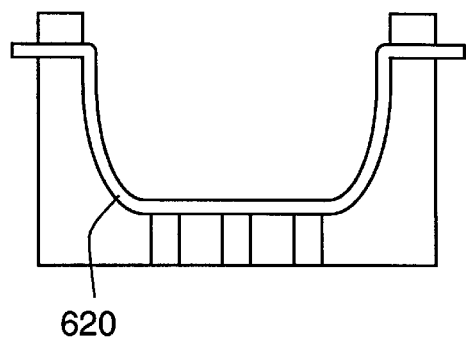
FIG. 8A  FIG. 8B
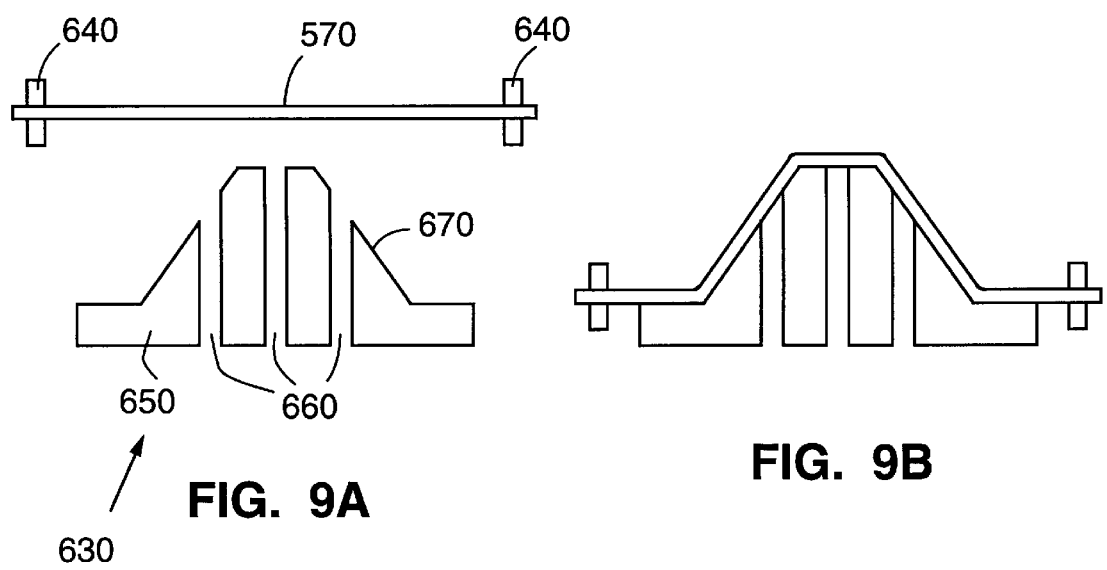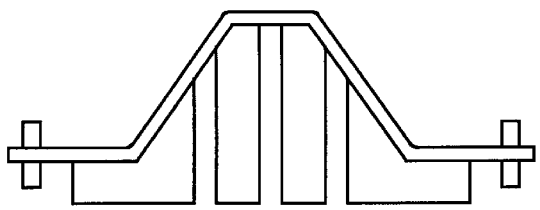
FIG. 9A  FIG. 9B

ELECTROLUMINESCENT LAMP DESIGNS

This application claims the benefit of the following four U.S. Provisional applications each of which is incorporated herein by reference:

(1) application Ser. No. 60/023,923, filed Aug. 14, 1996;
(2) application Ser. No. 60/031,715, filed Nov. 22, 1996;
(3) application Ser. No. 60/040,610, filed Mar. 17, 1997; and
(4) application Ser. No. 60/043,784, filed Apr. 11, 1997.

BACKGROUND

Since the discovery of electroluminescent lamps (EL lamps) in 1939 by Destriau in Paris, engineers and scientists have held out the hope that these new lamps would be a commercially useful alternative to conventional incandescent and fluorescent lamps. To date, however, these promises have remained mainly unfulfilled due to a variety of technical and scientific problems that have continually hindered the progress of EL lamp design. This erratic progress has not been for a lack of scientific and engineering endeavor, that has been spurred by the fact that the commercial applications for bright, cold, flexible EL lamps which are inexpensive to produce and which consume little power are immense and the financial rewards correspondingly large.

Most recently, engineers and scientists involved in EL lamp design have nearly universally concentrated their efforts in a laminar EL lamp design based on indium tin oxide (ITO) sputtered onto a polyethylene terephthalate (PET) film substrate. In this design, a phosphor material is typically sandwiched between a back electrode often made of a metal foil such as aluminum foil, and a translucent sputtered ITO coated PET film front electrode. These lamps are operated by applying an A.C. voltage across the electrodes and this causes the phosphor material to luminesce. In order for the light produced in the phosphor material to escape from the lamp, one or more of the electrodes must be translucent or transparent. This translucent electrode was originally made of conducting glass paper or a conducting transparent plastic; currently, however, nearly all EL lamps use a sputtered ITO coated PET film as the translucent electrode.

With the discovery of ITO, EL lamp designers believed they finally had a material that would allow the early hopes for EL lamps to be fulfilled. Unfortunately, this again turned out to be a somewhat false hope. Although the sputtered ITO based EL lamps currently produced are brighter and more durable than the original lamps of 50 years ago, these lamps still possess a number of drawbacks that have precluded their use in many everyday applications.

The main drawbacks of sputtered ITO based lamps are cost, processability, and electrical and optical characteristics. Although sputtered ITO coated PET films are easily available, they are expensive and can account for the bulk of the cost of materials for EL lamps. In addition to this excessive cost, EL lamps based on sputtered ITO coated PET films are not easily shaped. When using sputtered ITO coated films in a typical lamp construction, the ITO layer will crack when the EL lamp is bent creased or stretched. Sputtered ITO/PET based lamps cannot therefore easily be shaped using well known polymer processing techniques such as sheet forming techniques. For these reasons the sputtered ITO based lamps cannot easily be shaped into anything other than the simplest geometric forms. One further drawback of lamps based on sputtered ITO coated PET films is that their brightness and spectral properties (i.e., wavelength of light emitted) is severely limited by the range of frequencies and voltages that may be used to drive the lamps. In a typical lamp construction, sputtered ITO is deposited as an extremely thin layer and consequently the lamps cannot carry much current and cannot be driven at high frequencies. To ensure that the conventional lamps have a long enough lifetime to be commercially useful, it is necessary to drive sputtered ITO based lamps at relatively low frequency and voltage and this severely restricts the brightness of the resulting lamp. One further drawback of sputtered ITO based lamps is the lack of manufacturing reliability. The exacting processing requirements for manufacture of conventional sputtered ITO based lamps result in low yields. Typically only 60–75% of manufactured lamps pass quality control and are commercially useful.

As described above, the majority of EL lamps are operated by applying a voltage across front and back electrodes separated by the light emitting layer; however, there is an alternative design in which one of the electrodes is split into two and the voltage is applied across the two halves of the split electrode. In this "split-electrode" design, the EL lamp still incorporates the other "unsplit" electrode that in most cases is not connected to the voltage source and functions as what is called a "floating" electrode. Examples of split-electrode lamp construction are disclosed in U.S. Pat. Nos. 2,928,974, 4,534,734, and 5,045,755. It is important to note that in these split electrode lamps, the floating electrode is an integral part of the lamp construction and the lamp would not function if the floating electrode were removed. In operation, power is supplied to the two split electrodes which capacitively couple to the floating electrode and this causes a voltage difference between the split electrodes and the floating electrode over the entire area of the electrodes. Light is therefore emitted from the entire volume of light emitting material sandwiched between the split electrodes and the floating electrodes. As in the case of the unsplit electrode lamps, one of the electrodes must be transparent or translucent to allow light to be emitted from the lamp. The split electrode lamps operate in fundamentally the same manner as the standard unsplit lamps and they suffer from exactly the same cost, processability and optical characteristic drawbacks as the unsplit versions. In fact, since the split electrode lamps require extra or more involved production steps to produce the split electrodes, split-electrode lamps may be more difficult and therefore more costly to produce than the standard laminar lamps.

In summary then: The discovery and development of EL lamps held out the hope of inexpensive, flexible lamps that do not generate much heat and which consume very little power. Unfortunately, fifty years of development has failed to fulfill many of these initial promises. Present day lamps typically are of laminar construction based on a PET mounted transparent sputtered ITO electrode. These lamps suffer from a variety of drawbacks that make their commercialization for many applications unfeasible. Important among these drawbacks are cost, lack of easy processability, low manufacturing yields, and restricted lamp brightness.

SUMMARY

The present invention addresses the above problems in lamp construction and provides new approaches to EL lamp design. As described in detail below, these new approaches have allowed us to construct bright, durable, energy efficient, cool, extremely flexible, moldable EL lamps which can be driven at high frequencies for extended periods of time thus increasing both the brightness, lifetime, and accessible light output frequencies of the EL lamps as compared to the conventional lamps. In addition to these technical advantages, the lamps of the present invention are much simpler and much less expensive to manufacture than conventional lamps.

The present invention provides two broad categories of EL lamp, which we will call iso-planar and laminar style lamps.

Generally, the iso-planar lamps of the present invention include an electrically conductive layer divided into two or more electrically conductive elements by one or more channels. The lamps also include an electroluminescent material which at least partially fills a portion of the one or more channels or at least partially covers a portion of the two or more electrically conductive elements. It is preferred that the iso-planar lamps of the present invention include two conductive elements which may be fabricated in a wide variety of shapes including inter-digitated comb-like structures and circular and rectangular interleaved spiral structures. We describe in more detail the preferred conductive element structures in the detailed description section below. In a preferred embodiment of the invention, at least a portion of one of the conductive elements has a width of less than about 0.005 inches. Also, in a preferred embodiment of the invention at least a portion of one of the channels has a width of less than about 0.005 inches.

In an alternative embodiment of the iso-planar lamps, the lamp includes a translucent or transparent conductive layer spaced apart from the divided conductive layer. In this alternative embodiment, the electroluminescent material at least partially fills the volume between the divided conductive layer and the translucent or transparent conductive layer.

In a preferred method of manufacture, the iso-planar lamps are fabricated using either printing or etching techniques. In a preferred embodiment of the printing method, the conductive elements are first printed in the desired pattern on a substrate and the electroluminescent material is then deposited to at least partially fill a portion of the channels between the conductive elements or to at least partially cover a portion of the conductive elements. In a preferred printing method of manufacture, the conductive elements are printed using screen printing or off-set printing methods. In a preferred embodiment of the etching method, a conductive layer is coated with a photosensitive material that is exposed to electromagnetic radiation in either the pattern of the conductive elements or in the pattern of the channels. Next, either the exposed or unexposed photosensitive material is removed by being dissolved in a solvent to expose the conductive layer in a pattern corresponding to the channels in the final lamp. Next, the exposed conductive material is removed to form the channels and the remaining photosensitive material is also then removed. The iso-planar lamp is then completed by depositing the electroluminescent material as described above.

In an alternative method for manufacturing iso-planar lamps, a removable material is first deposited on a substrate in a pattern such that the area of the substrate that will support the conductive elements of the finished lamp is not covered by the removable material. Next, a conductive material is deposited onto the substrate on those areas not covered by the removable material and the removable material is then removed to leave the conductive elements. The lamp is then completed as described above. In a preferred embodiment of this method, the removable material and conductive materials are deposited using printing techniques.

The second broad category of lamp encompassed by the present invention are the laminar style lamps. Generally, these laminar style lamps include first and second electrically conductive layers and an electroluminescent material disposed between the first and second conductive layers. In the present invention the first electrically conductive layer includes a plurality of openings separated by electrically conductive elements. The laminar style lamps of the present invention may optionally include a translucent or transparent electrically conductive layer in electrical contact with the first conductive layer. In the embodiment that does not include the translucent or transparent electrically conductive layer, it is preferred that at least one of the openings in the first conductive layer has a minimum edge to edge distance of less than about 0.005 inches. In preferred embodiments of the invention, the first conductive layer includes rectangular or hexagonal shaped openings. In another preferred embodiment, at least a portion of one of the electrically conductive elements separating the openings in the first conductive layer has a width of less than about 0.002 inches. If the lamp includes a translucent or transparent electrically conductive material layer, it is preferred that this layer is made of particles of electrically conductive material suspended in a matrix.

In a preferred method of manufacture, the laminar style lamps of the present invention are fabricated using printing techniques. In a preferred embodiment of these methods, the lamps are manufactured using screen printing or off-set printing techniques. In one embodiment of the invention, a first electrically conductive layer is printed onto at least a portion of a substrate; an electroluminescent material is then deposited onto at least a portion of the first electrically conductive layer; and a second electrically conductive layer is printed onto at least a portion of the electroluminescent material.

Both the printed iso-planar and laminar style lamps of the present invention may be permanently reshaped. In this method of manufacture, the lamps are fabricated using printing techniques described above and are subsequently permanently reshaped using sheet forming techniques such as vacuum-forming or drape-forming. In this embodiment, it is preferred that the lamps are printed on a deformable substrate, that the first and second electrically conductive layers are made of particles of an electrically conductive material suspended in a curable matrix, and that the electroluminescent material is made of particles of electroluminescent material suspended in a curable matrix. In a preferred embodiment of this fabrication method, the lamp is permanently reshaped before the curable matrices are totally cured and the curable matrices are then cured after the lamps have been reshaped.

BRIEF DESCRIPTION OF DRAWINGS

The invention will be better understood by reference to the appended figures in which:

FIGS. 8A and 8B show cross-sectional views of an apparatus that may be used for reshaping electroluminescent lamps of the present invention;

FIGS. 9A and 9B show cross-sectional views of an apparatus that may be used for reshaping electroluminescent lamps of the present invention;

In these figures, identical or similar elements are designated by the same reference number.

DETAILED DESCRIPTION

We have discovered that using new EL lamp designs and new methods of fabrication it is possible to produce flexible, bright, durable, long-lasting EL lamps that consume little power, may be driven at higher frequencies than conventional lamps and may be formed into a variety of geometric shapes. As discussed in the Summary section, our lamp designs fall broadly into two categories: the first type has a laminar construction and includes a new approach to design of the electrodes and new fabrication methods; the second type does not use a laminar construction and this leads to what we call an "iso-planar" lamp.

In this detailed description section, we first describe the new laminar style lamps according to the present invention and then describe the iso-planar lamp design. For both types of lamp, we describe the structure of the lamps themselves and then describe the fabrication methods that may be used in their construction. After describing the different types of lamp, we describe the electronics that may be used to power these lamps and finally, we describe some comparative experimental results.

Laminar Style Lamps: Rectangular Grid Electrode

Figure 1:
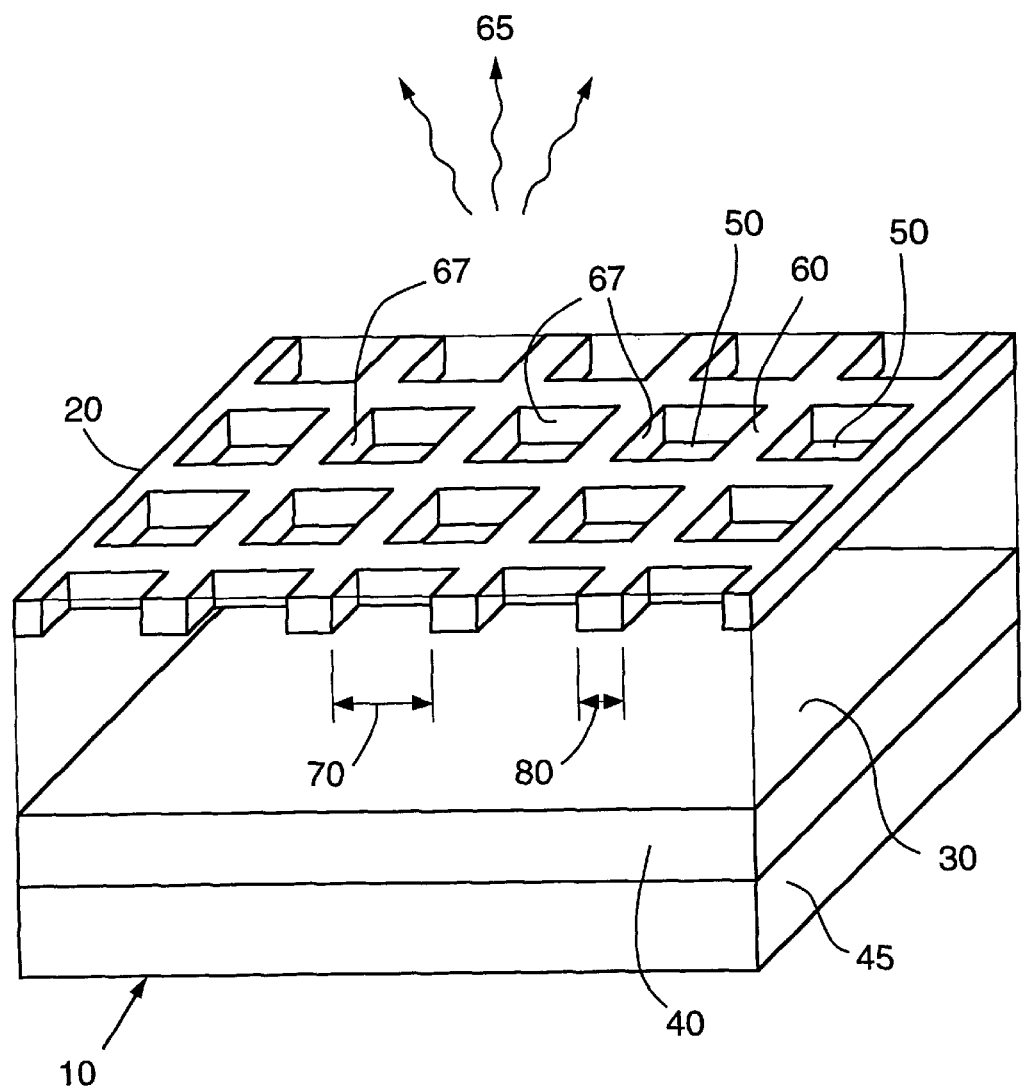
FIG. 1 shows a perspective top view and cross-sectional view of a portion of an electroluminescent lamp according to the present invention.
Figure 2:
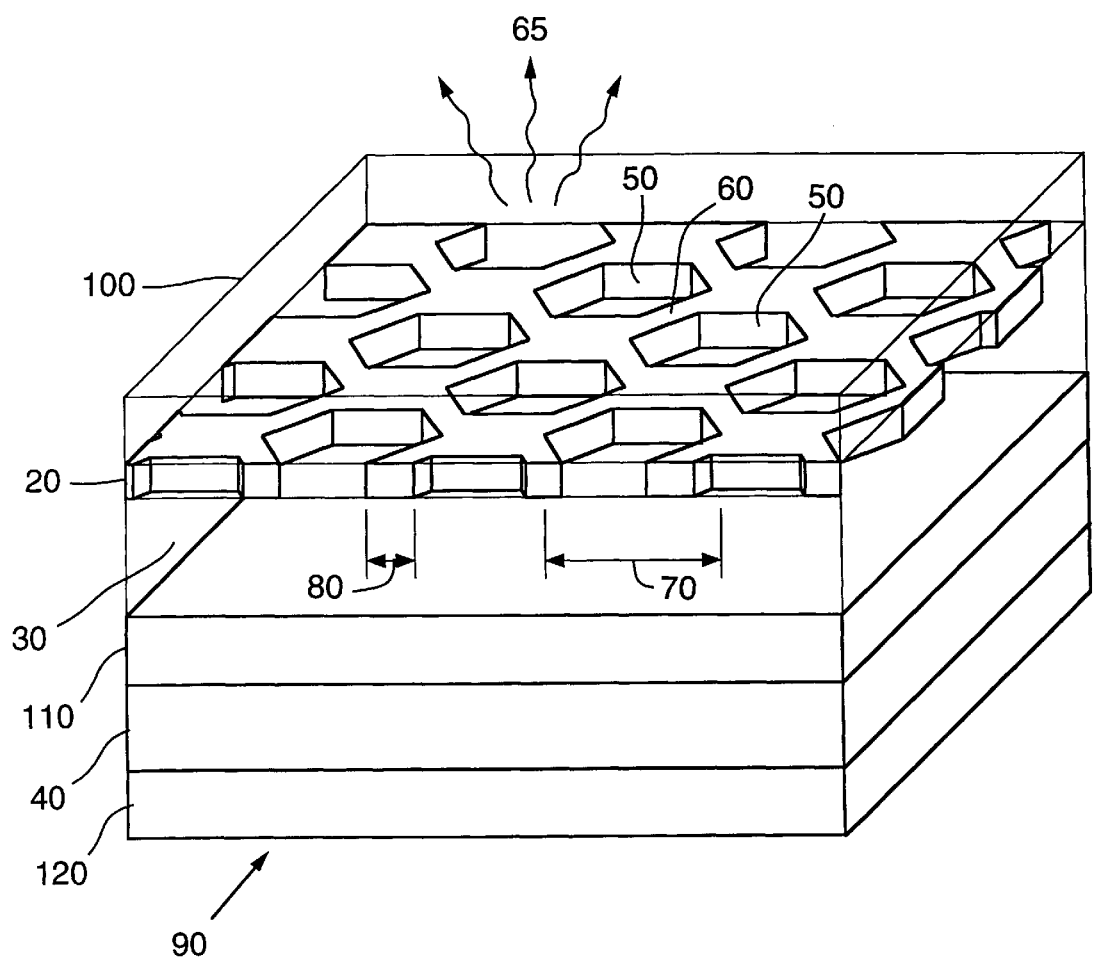
FIG. 2 shows a perspective top view and cross-sectional view of a portion of an electroluminescent lamp according to the present invention.
Figure 3:
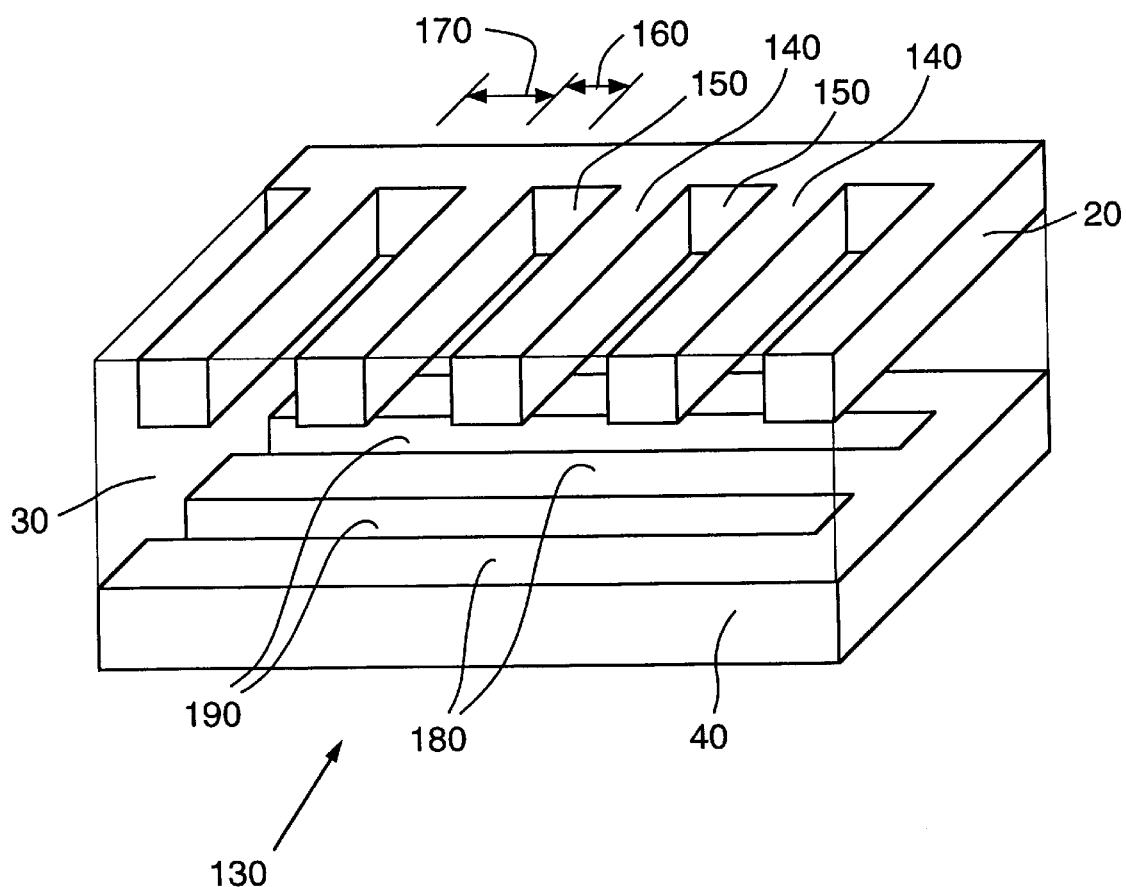
FIG. 3 shows a perspective top view and cross-sectional view of a portion of an electroluminescent lamp according to the present invention.

FIG. 1 shows a portion of an electroluminescent lamp 10 according to the present invention that includes a first conductive layer 20, an electroluminescent material 30, a second conductive layer 40, and an optional substrate 45 supporting the second conductive layer. In this embodiment, the first conductive layer 20 includes one or more openings 50 through the layer separated by conductive elements 60. FIG. 1 shows a first conductive layer with rectangular or square shaped openings arranged in a net like pattern; however, as will be discussed below, the invention is not limited to such an arrangement and a variety of opening shapes and arrangements are possible. For example, FIG. 2 shows a portion of an electroluminescent lamp according to the present invention in which the first conductive layer has a hexagonal grid like structure. FIG. 1 shows a second conductive layer 40 that is continuous; however, as will be discussed below, the second conductive layer may also include one or more openings. For example, FIG. 3 shows a portion of an electroluminescent lamp according to the present invention in which the second conductive layers include a plurality of elongated conductive elements 180 separated by openings 190.

In operation, the first and second conductive layers 20 and 40 are connected across a power source (not shown) which drives the lamp at a suitable voltage and frequency. Application of the power source subjects the electroluminescent material 30 to an electric field which in turn causes the electroluminescent material 30 to emit electromagnetic radiation. As is well known in the field, the characteristics of the emitted radiation depend on the electro-optical properties of the electroluminescent material together with the driving voltage and frequency of the power source. In a preferred embodiment of the invention, the emitted radiation is in the visible portion of the spectrum; however, as will be discussed below, lamps of the present invention may be driven at a higher frequency than conventional lamps and may emit radiation in the ultra-violet. This property may allow the lamps of the present invention to be used in applications for which the conventional lamps are not suitable. For example, the lamps of the present invention may be used to generate UV radiation that may then be used to energize a coating or incorporated particle of a phosphor material which may then emit visible radiation. In this respect, UV EL lamps may function in much the same way as a conventional fluorescent lamp. UV EL lamps may be able to take advantage of phosphors that emit bright blue, green, and red light and such phosphors may be used in the construction of a color display.

In the embodiment shown in FIG. 1, the light generated in the electroluminescent material 30 passes through openings 50 in the first conductive layer 20 and is detected by an observer positioned generally in direction 65. If the second conductive layer 40 also includes one or more openings, and if substrate 45 is translucent, the light is able to pass through both of the conductive layers and the lamp would emit from both sides. Such a double sided lamp is encompassed by the present invention.

We have discovered that in the lamps of the present invention such as that shown in FIG. 1, light is emitted primarily from the edges 67 of the conductive elements 60. Specifically, we have found that the light is emitted mainly from within about 0.001 inches of the edges of the conductive elements. Therefore, to maximize the area of the lamp's surface capable of emitting light, it is preferred that the minimum edge to edge distance 70 of the openings 50 is less than about 0.005 inches. In a more preferred embodiment, the minimum edge to edge distance of the openings is less than about 0.002 inches. When the conductive elements 60 are made of an opaque material, the area of the lamp that is covered by the conductive elements 60 cannot emit light;

therefore, to further maximize the area of the lamp's surface capable of emitting light, it is preferred that the width 80 of the conductive elements 60 is less than about 0.005 inches. In a more preferred embodiment, the width of the conductive elements is less than about 0.002 inches.

The brightness of a lamp depends on the density of opening through which the light generated in the electroluminescent material can pass. Specifically, an area of the lamp that has a high density of openings will emit more light than an area of the lamp that has a low density of openings. If a uniform brightness lamp is required the density of openings must therefore be approximately constant over the lamp's surface. If, on the other hand, a non-uniform pattern of light is required, this can be produced by varying the density of openings over the surface of the lamp. For example, it would be possible to construct a lamp that emits light in a specific pattern, a logo for example, by having a constant density of openings where the logo appears and no openings over the remainder of the lamp. In addition, shading may be accomplished by slowly varying the density of openings over the surface of the lamp.

Conductive Layers

Regarding the materials that may be used for the conductive layers 20 and 40: Generally, any electrically conductive material that can be formed into the geometries described above may be used. In the present invention, it is preferred that the conductive layers 20 and 40 are made of particles of conductive material suspended in a matrix. The particles of conductive material may generally be made of any conductive material; for example, conductive metals such as silver, nickel, copper etc. or conductive carbon and graphite particles may be used. The matrix may generally be any material capable of suspending the particles of conductive material. In a preferred embodiment of the invention, the matrix is a flexible matrix which allows for the manufacture of flexible lamps (see below); for example, suitable matrices include polyesters, epoxies, acrylics, cyano ethyl starch, and fluorohalocarbons such as Aclar. In another preferred embodiment, the matrix is a deformable matrix which allows the lamps to be vacuum-formed. We will generally refer to the methods of shaping the lamps as "vacuum-forming," however a more detailed description of these methods and other processing methods that may be used are discussed in detail below. Suitable deformable matrices include polyesters, urethane based resins, and epoxies. In a preferred embodiment of the invention, the conductive layers are made of cured or partially cured conductive inks such as those available from DuPont and Creative Materials, Inc. Typically the inks may be cured by heating, however some may also be cured by illumination with U.V. radiation. Examples of suitable conductive inks include silver ink (DuPont product # 5025) carbon ink (DuPont product # 7144) and conductive ink manufactured by Heraeus (product # PC-5328). In addition to these commercially available conductive inks, we have used a mixture of Engelhard DC100, 1 micron silver particles in DuPont #7155 matrix with a weight ratio of 70% matrix to 30% silver particles. For vacuum-formed lamps, DuPont silver ink # 5025 is preferred.

Electroluminescent Material

Regarding the materials that may be used for the electroluminescent material 30: Generally, any material that emits electromagnetic radiation when subjected to an electric field may be used. In the present invention, it is preferred that the electroluminescent material 30 is made of particles of electroluminescent material suspended in a matrix. The particles of electroluminescent material may generally be made of any material that is electroluminescent; for example, phosphor particles such as EL Phosphor type 30 manufactured by Osram Sylvania. The matrix may generally be any material capable of suspending the particles of electroluminescent material. In a preferred embodiment of the invention, the matrix is a flexible matrix which allows for the manufacture of flexible lamps; for example, suitable matrices include epoxies, cellulose based resins, acrylics, cyano ethyl starches, and fluorohalocarbons such as Aclar. In another preferred embodiment, the matrix is a deformable matrix which allows the lamps to be vacuum-formed; in this case, suitable matrices include urethane based resins and epoxies. In a preferred embodiment of the invention, the electroluminescent material is made of a cured or partially cured slurry of phosphor particles in an epoxy or cellulose matrix. Typically, the matrices may be cured by heating however some matrices may also be cured by illumination with U.V. radiation. Examples of phosphor/matrix combinations that may be used include premixed phosphor from DuPont (product # 7151) and a mixture of 30 g. of matrix from DuPont (product # 7155) and 64.5 g of Type 30 Green EL phosphor from Osram Sylvania (product # 729170). As is known in the art, Rhodamine may be added to the electroluminescent material to enable output of white light. In the above example, 9.0 ml of Rhodamine solution may be added to the matrix/phosphor mixture.

Substrate

The substrate 45 is optional and may not be required for proper functioning of the lamp. If the substrate is present, it may generally be made of any material capable of supporting the second conductive layer; if, however, the second conductive layer includes openings and the lamp is required to emit light from both sides, the substrate must be translucent or transparent to the light generated in the electroluminescent material 30. In a preferred embodiment, the substrate is a flexible substrate such as paper, card, plastic, rubber or woven fabric. Preferred substrates include, but are not limited to, polystyrene and polyesters such as PET. In the case when the substrate is required to be translucent or transparent, a substrate made of translucent or transparent plastic is preferred; for example, PET may be used. A substrate that includes openings for the light to pass through is another example of a suitable translucent or transparent substrate; an example of this type of substrate is a woven cloth material such as nylon, cotton, or silk materials. In another preferred embodiment, the substrate is a deformable substrate which allows the lamps to be vacuum-formed. In this case, a suitable substrate is a polystyrene film.

FIG. 1 shows a lamp that is substantially flat in design; however, as will be described in detail below, the lamps of the present invention may be flexible and may therefore be formed into a variety of geometrical shapes. In addition, the lamps of the present invention may be stretched and permanently reshaped into geometrical forms using a variety of processing techniques such as vacuum-forming and drape forming, which are described in detail below. For these reasons, shaped, non-flat electroluminescent lamps having substantially the same conductive layer geometry (i.e., openings 50 etc) as shown in FIG. 1 are encompassed by the present invention.

The embodiment shown in FIG. 1 may optionally include a translucent or transparent dielectric layer covering the first conductive layer 20. Suitable dielectric materials are well known in the art and are discussed below. Suitable materials include acrylates such as DuPont product # 5018. The embodiment shown in FIG. 1 may also optionally include a dielectric layer between the second conductive layer 40 and the electroluminescent material 30. Again, suitable dielectric materials are well known in the art and are discussed below. Suitable materials include DuPont product # 5018 and reflective dielectrics such as DuPont product # 7153.

Laminar Style Lamps: Hexagonal Grid Electrode

FIG. 2 shows a portion of another electroluminescent lamp 90 according to the present invention that includes a first conductive layer 20, an electroluminescent material 30, a second conductive layer 40, a substrate 100 supporting the first conductive layer 20, a dielectric layer 110 between the electroluminescent material 30 and the second conductive layer 40, and a dielectric protective layer 120 coating the second conductive layer 40. FIG. 2 shows an embodiment of the invention in which the first conductive layer 20 includes approximately hexagonal shaped openings arranged in a honeycomb like pattern.

As in the embodiment shown in FIG. 1, the substrate is optional and may not be required for proper functioning of the lamp.

The dielectric layer 110 is optional and may not be required for proper functioning of the lamp. If present, the dielectric layer may generally be made of any dielectric material known in the art. In the present invention, however, it is preferred that the dielectric layer is made of a flexible dielectric material which allows for the manufacture of flexible lamps. For example, the dielectric layer may be made of acrylate or epoxy resins. In another preferred embodiment of the invention, the dielectric layer may be a deformable dielectric layer that allows the lamps to be vacuum-formed. In a preferred embodiment of the invention, the dielectric layer 110 is reflective of the light generated in the electroluminescent material 30. This increases the brightness of the lamp since light will be reflected from dielectric layer 110 through openings 50 to the observer positioned in direction 65. In a preferred embodiment, the reflective dielectric layer is made of reflective particles suspended in a dielectric material such as those described above. Examples of suitable reflective particles includes but is not limited to particles made of $TiO_2$. An example of a suitable reflective dielectric is a dielectric made by DuPont (product # 7153). If the lamp is a double sided lamp, the dielectric layer 110 must be translucent or transparent to the light generated in the electroluminescent material 30. Suitable translucent or transparent dielectric materials include acrylates, for example DuPont product # 5018.

The dielectric protective layer 120 is optional and may not be required for proper functioning of the lamp. If present, the dielectric protective layer may generally be made of any dielectric material known in the art that is capable of environmentally protecting and sealing the second electrode 40. In the present invention, it is preferred that the dielectric protective layer is a flexible layer which allows for the manufacture of flexible lamps; for example, the protective dielectric layer may be made of PET, PVC, or polyethylene. Suitable protective dielectrics include DuPont's dielectric product # 5018. In another preferred embodiment of the invention, the dielectric protective layer may be a deformable dielectric layer which allows the lamps to be vacuum-formed. Suitable deformable dielectric materials include acrylates, for example DuPont product # 5018. If the lamp is a double sided lamp, the dielectric protective layer must be translucent or transparent to the light generated in the electroluminescent material 30. In this case, the dielectric layer may be made of varnishes or acrylates such as DuPont product # 5018.

Laminar Style Lamps: Comb-Like Electrodes

FIG. 3 shows a portion of another electroluminescent lamp 130 according to the present invention that includes a first conductive layer 20, an electroluminescent material 30, and a second conductive layer 40. The lamp may optionally include a substrate layer supporting either the first or second conductive layers and the lamp may also include dielectric layers as shown in FIG. 2. FIG. 3 shows an embodiment of the invention in which both the first and second conductive layers 20 and 40 includes a plurality of elongated conductive elements (140 and 180 respectively) separated by channels (150 and 190 respectively). In the embodiment shown, the elongated conductive elements are approximately parallel to the other elements in that layer and are approximately perpendicular to elements in the other layer. For similar reasons as discussed with reference to FIG. 1, it is preferred that the elongated conductive elements have a width 160 of less than about 0.005 inches and it is more preferred that they have a width 160 of less than about 0.002 inches. It is also preferred that the channels have a width 170 of less than about 0.005 inches and it is more preferred that they have a width 170 of less than about 0.003 inches.

Laminar Style Lamps: Including Translucent Electrode

Figure 4:
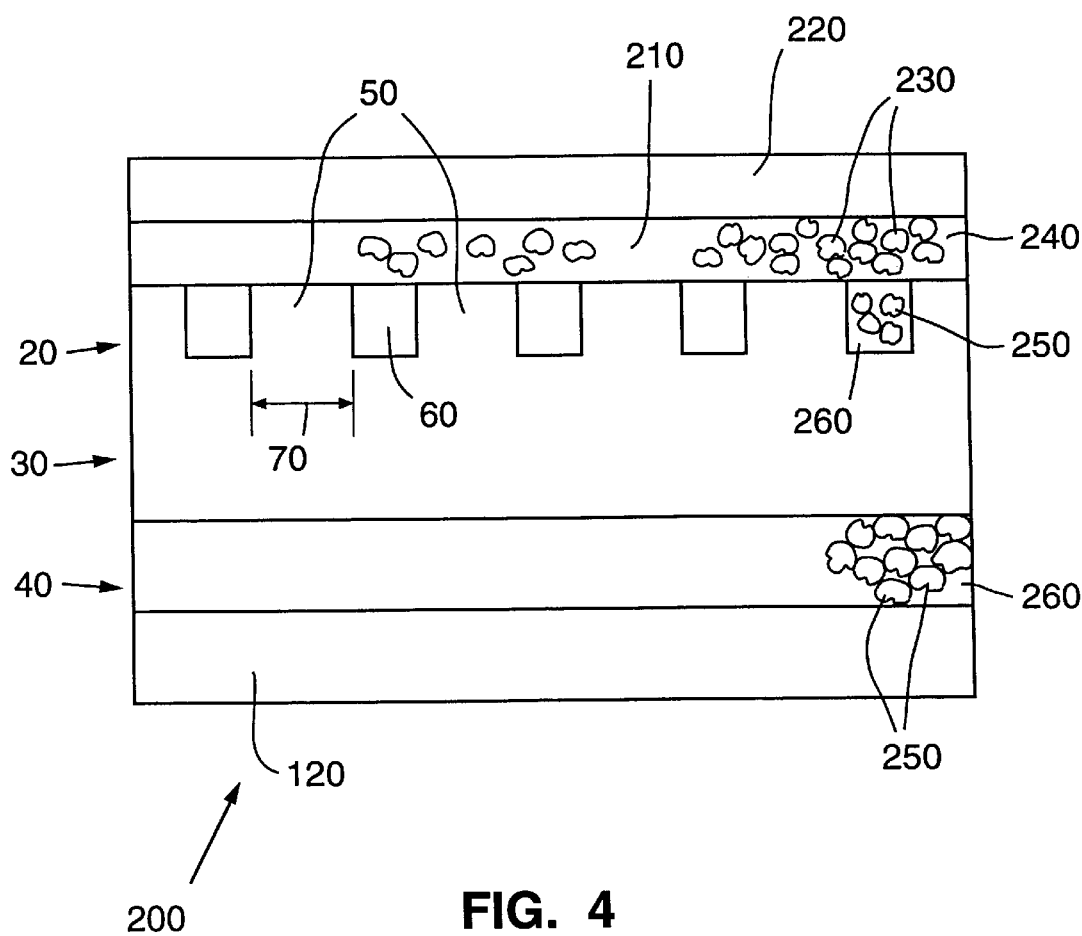
FIG. 4 shows a cross-sectional view of a portion of an electroluminescent lamp according to the present invention.

FIG. 4 shows a portion of another electroluminescent lamp 200 according to the present invention that includes a first conductive layer 20, an electroluminescent material 30, a second conductive layer 40, an optional dielectric protective layer 120, a translucent or transparent electrically conductive material 210 in electrical contact with the first conductive layer, and an optional translucent or transparent substrate 220 supporting the translucent or transparent conductive layer.

FIG. 4 shows a preferred embodiment of the present invention in which conductive layers 20 and 40 include conductive particles 250 suspended in a matrix 260.

Translucent or Transparent Conductive Layer

Regarding the materials that may be used for the translucent or transparent electrically conductive material 210: Generally, any material that is translucent or transparent to the light generated in the electroluminescent material 30 and is conductive may be used. For example, transparent or translucent conductive polymers may be used such as those manufactured by Acheson, product # DB2320. In the present invention, it is preferred that the translucent or transparent electrically conductive material is made of particles of translucent or transparent conductive material 230 suspended in a matrix 240. The particles of translucent or transparent conductive material may generally be made of any translucent or transparent conductive material; for example, particles of indium tin oxide may be used. The matrix may generally be any material capable of suspending the particles of translucent or transparent conductive material. In a preferred embodiment of the invention, the matrix is a flexible matrix which allows for the manufacture of flexible lamps; for example, the matrix may be polyesters, epoxies, or cellulose based resins. In another preferred embodiment, the matrix is a deformable matrix which allows the lamps to be vacuum-formed. A suitable translucent or transparent electrically conductive material may be made of a printable ITO conductor available from DuPont (product # 7160) or Acheson (product # SS 24823).

In operation of the lamp shown in FIG. 4, the translucent or transparent electrically conductive material 210 is in electrical contact with the first conductive layer 20 and therefore allows a substantial electric field to be maintained between the second conductive layer and translucent or transparent electrically conductive material 210 over the whole surface of the lamp. This results in the electroluminescent material 30 emitting light from the whole surface of the lamp. This is in contrast to the lamps without the translucent or transparent electrically conductive material in which light is only emitted from that area close to the edges of the conductive elements 60. Since in the lamp shown in FIG. 4 light is not restricted to only being emitted from the edges of the conductive elements, the minimum edge to edge distance of the openings 50 may be larger than in the lamps without the translucent or transparent conductive layer. In this embodiment of the invention, the minimum edge to edge distance 70 of the openings 50 will be determined by the conductivity of the translucent or transparent conductive layer. For example, when the translucent or transparent electrically conductive material is made of the ITO particle suspension describe above the resistivity of the layer is about 1000 Ω per square. For comparison, the resistivity of a layer of the conventional sputtered ITO is only about 60 Ω per square. Although the resistivity of the ITO suspension is greater than the sputtered ITO, a translucent or transparent electrically conductive material made of the ITO suspension has the important advantages that it may be easily fabricated using printing methods (see below). A further important advantage is that lamps that include an ITO suspension layer may be extremely flexible and may be shaped using the processing techniques described below. In a preferred embodiment using the ITO suspension described above, lamps 200 include a conductive layer 20 with openings 50 of minimum edge to edge distance 70 between about 0.3 inches and about 0.7 inches and conductive element width 80 of about 0.005 inches. The exact optimal minimum edge to edge distance of the openings will depend amongst other things on the resistivity of the translucent or transparent conductive layer; however, given this resistivity together with the teachings described here one skilled in the art would well understand how to modify the geometry described above to optimize the light output of the lamp.

FIG. 4 shows an embodiment of the invention with a translucent or transparent electrically conductive material 210 positioned on top of the first conductive layer 20. In another embodiment of the invention, the conductive layer 210 may be positioned between the electroluminescent material 30 and the first conductive layer.

Laminar Style Lamps: Including "Floating" Electrodes

Figure 5A:
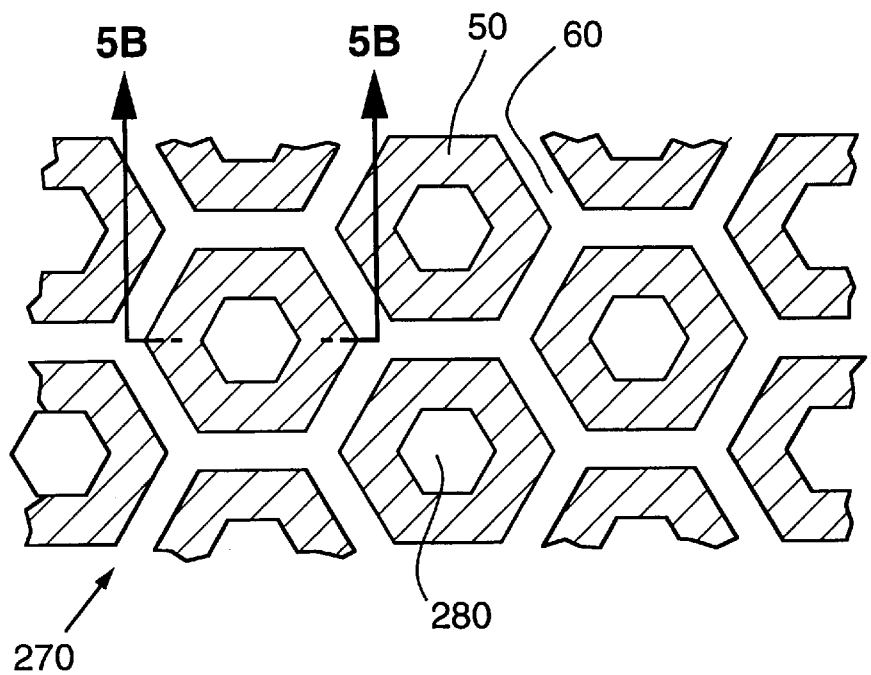
FIG. 5A shows a top plan view and FIG. 5B shows a cross-sectional view of a portion of an electroluminescent lamp according to the present invention.
Figure 5B:
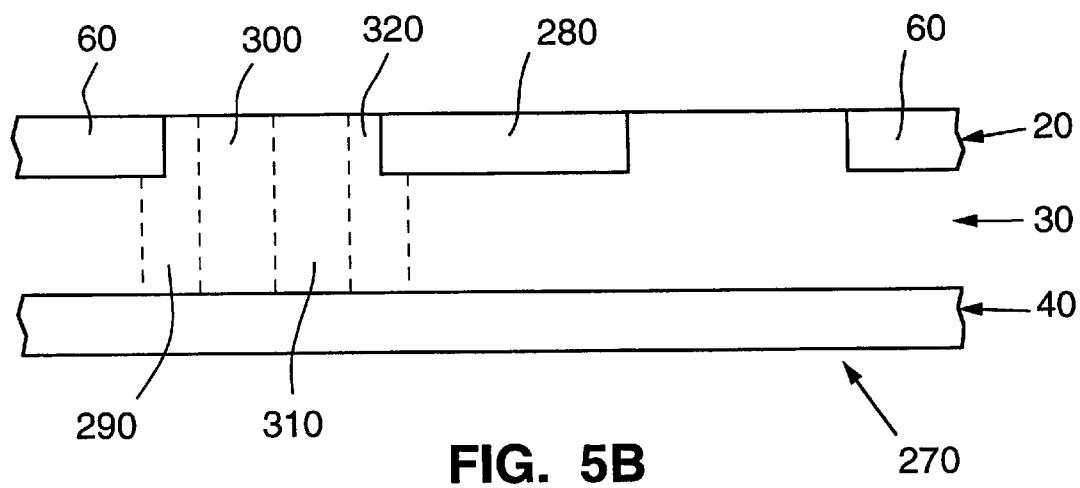

FIG. 5 shows an embodiment of the invention in which the geometry of the conductive layers is chosen so that when the voltage driving the EL lamp is changed, different volumes of the electroluminescent material emit light. During lamp operation, the electroluminescent material emitting light tends to decay and emit less light over time; therefore, in this embodiment of the invention, changing the driving voltage will allow the lamp to use fresh, undecayed electroluminescent material and this may help increase the useful lifetime of the lamp.

Specifically, FIG. 5 shows an electroluminescent lamp 270 that includes a hexagonal grid style first conductive layer 20, which includes "floating" conductive elements 280 positioned in the openings 50. Without being bound by theory, we hypothesize that in operation the lamp 270 initially only emits light from the volume of electroluminescent material 290 closest to the conductive elements 60. During initial operation, the remaining volumes of electroluminescent material 300, 310, & 320 do not emit light. Over time, the electroluminescent material in volume 290 may start to decay and emit less light. However, using the lamp 270, it is possible to maintain lamp brightness by accessing new volumes of electroluminescent material. Volumes 300, 310, & 320 represent regions of new or unaffected electroluminescent material and if the voltage across the lamp is increased, these unaffected volumes may be accessed. The result of this procedure is that applying more voltage will increase the life of the lamp and hold the brightness steady throughout the lamp life. We hypothesize that the "floating" conductive element 280 helps increase the electric field in volumes 300, 310, & 320 as the applied voltage is increased.

The embodiment of the invention shown in FIG. 5 solves the problem of decay of lamp brightness in a very different manner than that used in the conventional sputtered ITO based lamps. Conventionally, the solution to the degradation of the electroluminescent material is to increase the voltage to the lamp to compensate for loss of brightness. The problem with this solution is that in a sputtered ITO based construction one cannot access new volumes of electroluminescent material but can only add more power to an already decayed volume, and this has the effect of shortening the overall life of the lamp.

Laminar Style Lamps: X-Y Array

Figure 6:
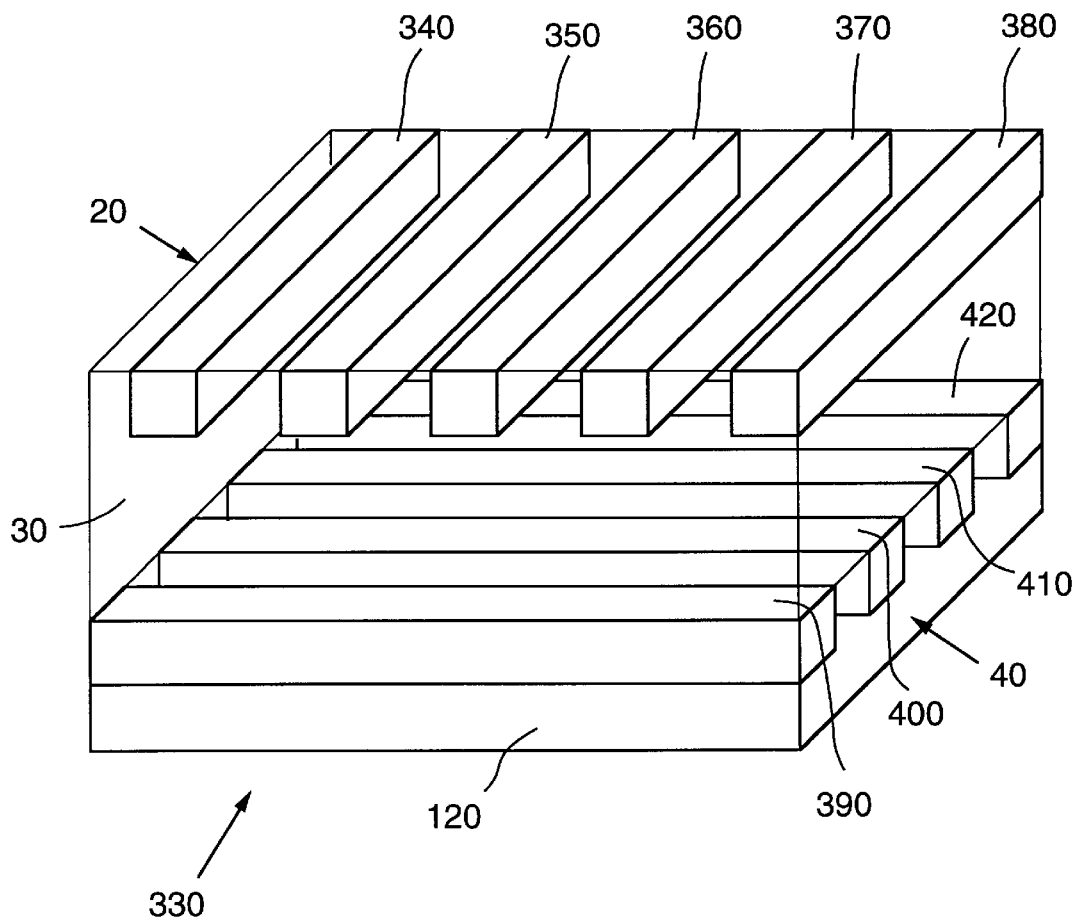
FIG. 6 shows a perspective top view and cross-sectional view of a portion of an electroluminescent lamp according to the present invention.

FIG. 6 shows one embodiment of the present invention in which individual well defined areas of the lamp (pixels) may be individually illuminated, thereby allowing the lamp to be used to generate patterns and pictures. Specifically, FIG. 6 shows a lamp 330 that includes a first conductive layer 20, an electroluminescent material 30, a second conductive layer 40, and an optional dielectric protective layer 120 coating the second conductive layer. The lamp may optionally include a substrate supporting the first conductive layer. In lamp 330 the first conductive layer 20 includes a plurality of insulated, elongated conductive elements 340–380 and the second conductive layer 40 includes a plurality of insulated, elongated conductive elements 390–420. In the lamp 330, the elongated conductive elements 340–380 are all approximately parallel and the elongated conductive elements 390–420 are all approximately parallel and are all approximately perpendicular to the elongated conductive elements 340–380. In operation, when power is supplied to element 360 in the first conductive layer and element 410 in the second conductive layer for example, the electroluminescent material that occupies the volume that is approximately between where these two elements cross will emit light. Those skilled in the art will understand that the lamp 330 can be driven by connecting the individual elongated conductive elements to a suitable controller which supplies power to the individual elements in some predetermined sequence. In this manner, the controller is capable of energizing individual volumes of electroluminescent material, thereby causing the lamp to emit patterns of light and dark which can change with time.

Although FIG. 6 shows a lamp that includes elongated conductive elements that are approximately perpendicular, those skilled in the art will understand that this geometry is not critical to the operation of the lamp and lamps with different orientations of elongated conductive elements is possible. Those skilled in the art will also understand that other patterns of conductive elements may be used.

Laminar Style Lamps: X-Y Color Display

Figure 7:
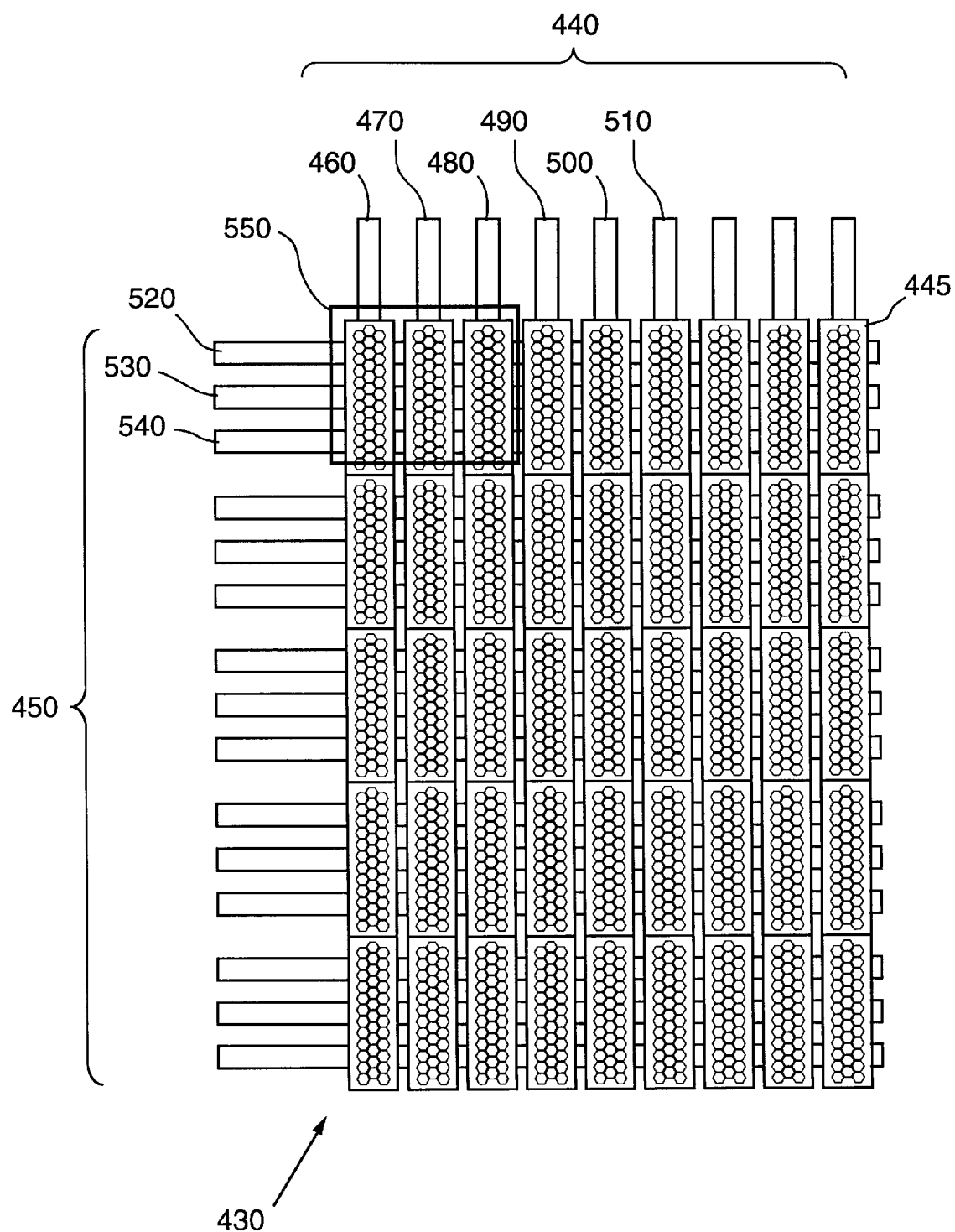
FIG. 7 shows a top plan view of a portion of an electroluminescent lamp according to the present invention.

FIG. 7 shows a lamp 430 capable of outputting color images. In this embodiment, the first conductive layer 20 includes a plurality 440 of insulated elongated conductive elements and the second conductive layer 40 includes a plurality 450 of insulated elongated conductive elements. A translucent or transparent, colored layer is overlaid on the first conductive layer (not shown) such that the elongated conductive elements 440 are alternately covered by red, blue, and green, colored overlayers. For example, elongated conductive elements 460, 490, . . . are overlaid by a translucent or transparent red layer, elongated conductive elements 470, 500, . . . are overlaid by a blue layer, and elongated conductive elements 480, 510, . . . are overlaid by a green layer. The overlap area of three consecutive elements in the first conductive layer and three consecutive elements in the second conductive layer define one pixel. For example, in FIG. 7 the overlap of elements 460, 470 & 480 with elements 520, 530, & 540 define pixel 550. In operation, by energizing different combinations of the elements 460–480 and 520–540 it is possible to create a color that is a combination of red, blue and green. In the embodiment shown in FIG. 7, the elongated conductive elements 440 are separated into individual cells 445 which include a hexagonal grid pattern.

Fabrication of Laminar Style Lamps

One important advantage of the lamps of the present invention is that they may be simply and inexpensively fabricated using printing techniques. In addition to being flexible these lamps may also be suitable for vacuum-forming which can be used to produce lamps in a variety of intricate geometric shapes.

In a preferred printing method of the present invention, a first electrically conductive layer is initially deposited on at least a portion of a substrate using suitable printing techniques. When the first electrically conductive layer includes openings, the layer is printed in the required pattern of conductive elements and openings. An electroluminescent material is then deposited on at least a portion of the first electrically conductive layer and finally a second electrically conductive layer is printed on at least a portion of the electroluminescent material. Again, if the second electrically conductive layer includes openings the layer is printed in the required pattern. Optional dielectric protective and reflective layers may be printed as required.

The substrate may generally be made of any material on which the lamp may be printed. Preferred substrates have been described in detail in the previous sections.

The first and second electrically conductive layers may be printed using any material that is electrically conductive and may be printed. For example, the first and second electrically conductive layers may be printed using a suspension of electrically conductive particles in a matrix. Preferred electrically conductive particles and matrices have been described in detail in the previous sections. Suitable materials include electrically conductive inks such as those containing silver, nickel, or copper. Conductive inks are available from a variety of manufacturers including DuPont and Creative Materials, Inc. The first and second electrically conductive layers may be made of the same or different conductive materials.

The electroluminescent material may be made of any material that is electroluminescent and may be printed. In a preferred embodiment, the material comprises particles of electroluminescent material dispersed in a matrix. Suitable materials include phosphor particles such as EL Phosphor type 30 manufactured by Osram Sylvania. Suitable matrices include an epoxy or cellulose.

The optional dielectric layers may be made of any material that is an electrical insulator and may be printed. Suitable materials for printing the dielectric layer include acrylates and epoxies.

One advantage of the present invention is that flexible electrically conductive layers, electroluminescent material, and dielectric layers (if included) may be printed on a flexible substrate. In this case, the EL lamp is extremely flexible and may be formed into a variety of shapes using known techniques. For example, the flexible EL lamp may be attached to a solid item and thus made to conform to the shape of that item. As described in detail below, the flexible EL lamp may also be vacuum formed in which case the conductive layers, electroluminescent material, and dielectric layers (if included) must be deformable to allow for vacuum forming.

The electrically conductive layers, electroluminescent material, and dielectric layers may generally be deposited using any suitable printing technique. Preferred techniques include screen and offset printing methods. Using screen printing methods, we have found that it is possible to simply and inexpensively fabricate the lamps of the present invention. Using screen and offset printing methods will allow the conductive layers to be simply printed in the precise geometrical patterns described in the previous section. In addition, it may be possible to use spray painting, ink jet printing, or plotting (using an HP plotter for example) to deposit the precise geometrical shapes required in the lamp manufacture. For the electroluminescent and dielectric layers, which may not require printing in such intricate patterns, other printing methods such as rotogravure, spray painting, doctor blade, or squeegee printing may also be used. It is most preferred to print the conductive layers using offset printing techniques since this allows much simpler, more rapid, and inexpensive printing of the lamps.

With the exception of the fabrication of vacuum-formed lamps described below, the individual printing and curing steps used for fabricating the lamps of the present invention are well known in the art.

Sheet Forming of Lamps

As described previously an important advantage of the lamps of the present invention is that they may be deformed and permanently shaped using a variety of conventional processing techniques known generically as sheet forming or thermoforming techniques. Two examples of such techniques are vacuum-forming and drape forming. FIGS. 8 and 9 show schematics of apparatus that may be used to carry out these processing methods. An important difference between the lamps of the present invention and the conventional sputtered ITO lamps is that it is possible to form our lamps using these well known processing techniques.

FIG. 8 shows a schematic of an apparatus 560 for vacuum forming a lamp 570. The apparatus includes a mold 580, clamps 590 for clamping the lamp 570 to the mold, a volume 600 defined by the mold, and openings 610 through the mold connecting volume 600 to a vacuum source (not shown). In operation, the lamp 570 is clamped to the mold 580 by clamps 590. A vacuum is applied to volume 600 via openings 610 and this deforms the lamp causing it to conform to the surface of the mold 620. When the lamp is released from the mold it retains the shape of the mold surface 620. In an alternative embodiment, rather than apply a vacuum to volume 600 extra pressure is applied to the lamp from above to cause it to conform with the mold surface. In another embodiment, the lamp can be formed into a simple dome structure without the need of a mold. In this case, the lamp is deformed by applying either a vacuum or a positive pressure as described above but the vacuum-formed lamp is allowed to take on its natural domed shape that results from clamping and deforming the lamp.

FIG. 9 shows a schematic of an apparatus 630 for drape forming lamp 570. The apparatus includes a mold 650, clamps 640 for clamping the lamp 570, and optional openings 660 through the mold connecting mold surface 670 to a vacuum source (not shown). In operation, the lamp 570 is secured by clamps 640 and is then lowered over mold 650 to conform the lamp to the shape of the mold surface 670. A vacuum may be applied to mold surface 670 via openings 660 to assist in conforming the lamp to the mold shape. When the lamp is released from the mold it retains the shape of the mold surface 670.

In the case of vacuum forming, we have found that in a preferred method the conductive, electroluminescent, and any optional dielectric layers are only partially cured before the lamp is vacuum formed. After the lamp has been formed the layers are then completely cured.

For vacuum-forming of lamps, it is preferred to use lamps such as those shown in FIG. 4 that include both a first electrically conductive layer and a translucent or transparent electrically conductive layer. It is also preferred to use lamps with a polystyrene substrate and a translucent or transparent electrically conductive layer made of Acheson product # DB2320 or SS-24823.

Iso-planar Lamp Design

As described in the background section, conventional sputtered ITO/PET based lamps posses many drawbacks. The design of the laminar lamps of the present invention described above overcome many of these drawbacks. However, one important processing drawback still remains; namely, that the electroluminescent material, which is sandwiched between the lamp's two parallel electrically conductive layers, must be deposited as a very uniform layer. Typically, the electroluminescent material is about 0.002 inches thick and it is extremely difficult to consistently produce such a thin uniform layer using commercially viable processing techniques. In laminar style lamps, variations in the thickness of the electroluminescent material result in a lamp with non-uniform light output across their surface. Variation in thickness of the electroluminescent material affect the electric field that the material experiences and this in turn affects the light output from the electroluminescent material. In some cases, this variation in thickness may cause the performance of some commercially available lamps to vary from batch to batch.

Another drawback of the laminar style lamps is that pinholes can form when printing thin layers. What happens in this case is that small gas bubbles present in the electroluminescent material rise to the surface of the material as it cures and this causes small voids in the material. These voids can cause the lamps to short out and can seriously limit the voltages used to drive the lamps. To correct the pinhole problems, layers are usually printed twice with the hope that the second print will fill in any voids or pinholes. The process of overprinting to prevent pinholes is labor intensive because precise registration is required when applying the second print. In addition, since each printed layer needs to be cured or dried, more process time is needed to perform the additional steps.

We have discovered a completely new approach to the design and fabrication of EL lamps which overcomes the above problems. In our new lamp design, the two conductive layers or electrodes are not spaced apart in approximately parallel planes as is the case in the conventional lamps. In our new design of lamps both electrically conductive layers lie in approximately the same plane and for this reason we call these lamps "iso-planar" lamps.

FIGS. 10 through 14 show embodiments of our iso-planar lamp designs.

Iso-planar Lamps: Inter-Digitated Electrodes

Figure 10:
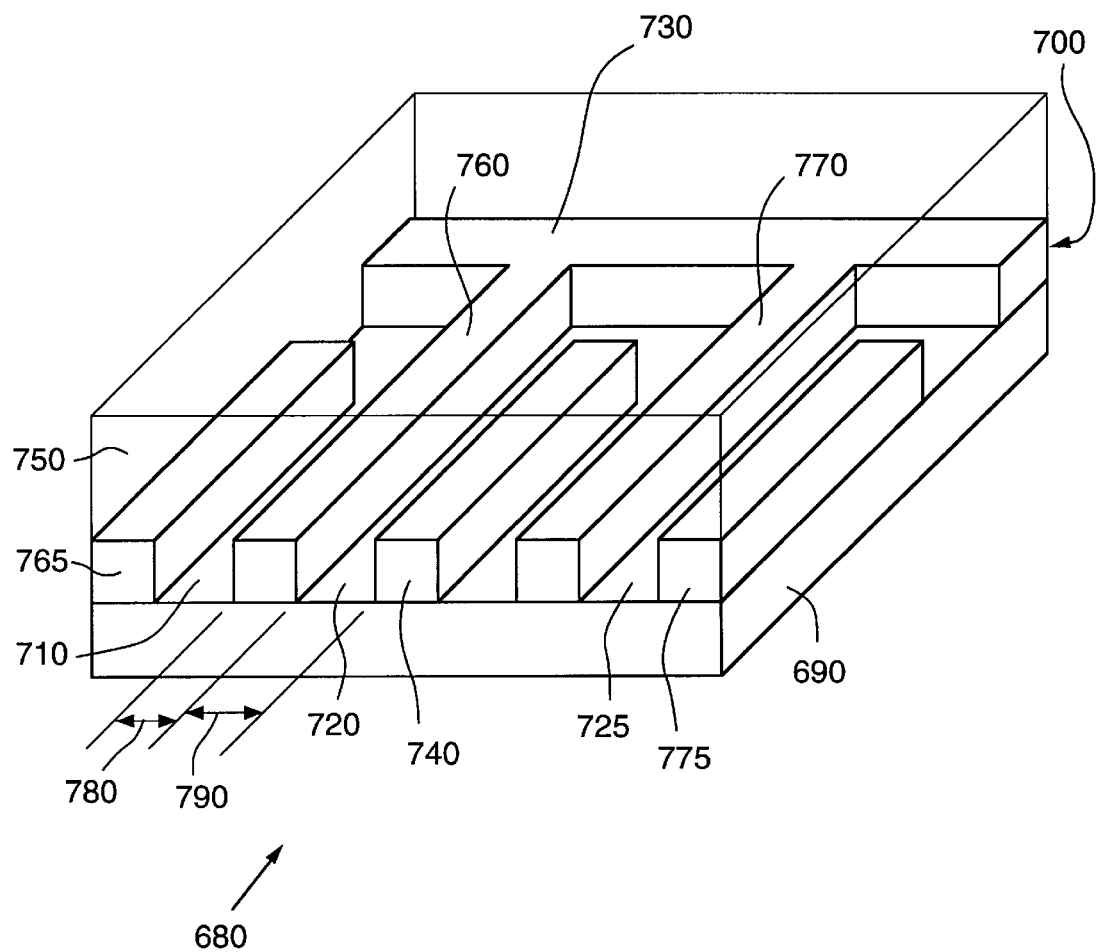
FIG. 10 shows a perspective top view and cross-sectional view of a portion of an electroluminescent lamp according to the present invention.
Figure 11A:
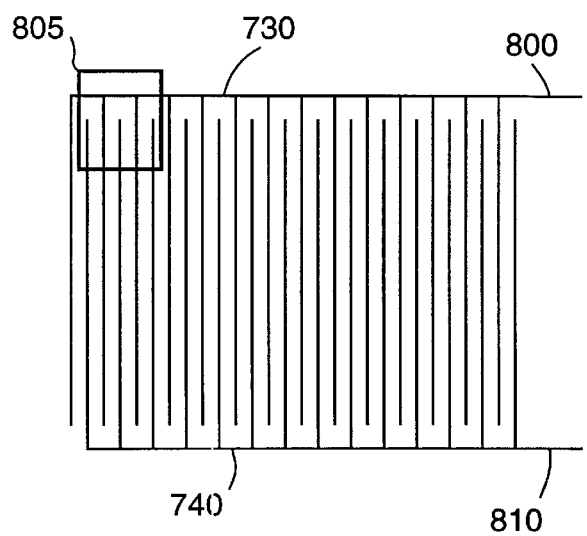
FIGS. 11A–11D show top plan views of electroluminescent lamps according to the present invention.
Figure 11B:
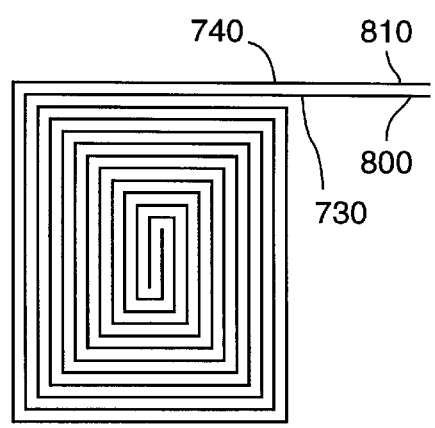
Figure 11C:
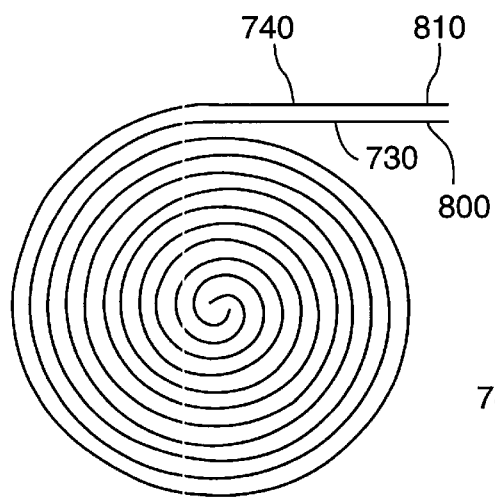
Figure 11D:
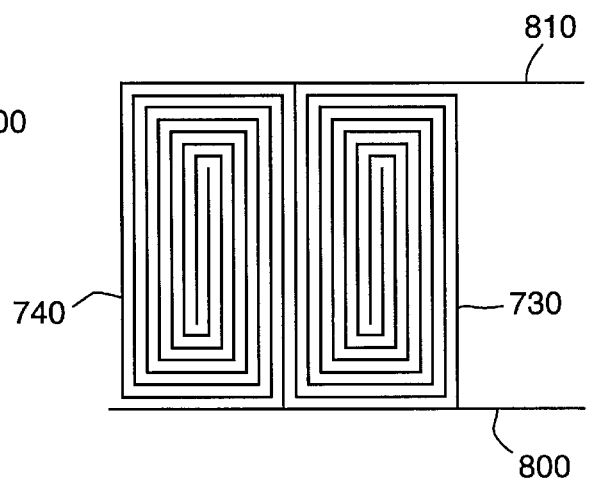

FIG. 10 shows a portion of lamp 680 according to the present invention that includes a substrate 690, and a first conductive layer 700 supported on the substrate. The first conductive layer includes one or more channels 710, 720 and 725 dividing the first conductive layer into two or more conductive elements 730 and 740, 765 & 775. In the embodiment in FIG. 10, the three conductive elements labeled 740 765 & 775 are insulated from conductive element 730. In a preferred embodiment these elements (i.e. 740 765 & 775) are themselves electrically connected (See FIG. 11A). The lamp 680 also includes an electroluminescent material 750 that at least partially fills a portion of one or more of the channels 710, 720 and 725 or at least partially covers a portion of the conductive elements 730, 740, 765 and 775.

In operation conductive elements 730 and 740, 765 & 775 are connected across a power source and this causes the lamp to emit light. Without being bound by theory, we hypothesize that the power supplied to the conductive elements energizes the electroluminescent material positioned approximately between these elements (i.e. in the channels 710, 720, and 725) and this material emits light.

FIG. 10 shows a lamp in which, the insulated conductive elements include a plurality of elongated conductive elements. For example, conductive element 730 includes elongated conductive elements 760 and 770. We have found that the amount of light emitted from a lamp such as that shown in FIG. 10 depends on the width of the conductive elements 780, the width of the channels 790, and on the cross-sectional shape of the conductive elements. FIG. 10 shows an portion of a lamp with an interdigitated set of two insulated conductive elements 730 and 740 765 & 775; however, other patterns of insulated conductive elements are also suitable.

Iso-planar Lamps: Electrode Layout

FIG. 11 shows examples of four embodiments of the present invention including different patterns of insulated conductive elements. Each lamp design includes insulted conductive elements 730 and 740 separated by one or more channels. Conductive element 730 may be attached to the power source (not shown) by connection 800 and conductive element 740 may be attached to the power source via connection 810. FIG. 11A shows an interdigitated design a portion of which 805 is similar to that shown in FIG. 10.

In the present invention, the insulated conductive elements may generally be of any shape provided they are spaced apart (i.e., insulated from one another). Since the lamp brightness depends on the distance between adjacent portions of the conductive elements, the shape and relative geometries of the conductive elements will affect the brightness and uniformity of the emitted light. If an EL lamp of uniform brightness is required, adjacent portions of the conductive elements should be equally spaced over the entire lamp. In contrast, an EL lamp that emits light in a non-uniform pattern may easily be fabricated by appropriate choice of conductive element shape. In such a lamp, those areas containing closely spaced conductive elements will emit brighter light than those areas containing less closely spaced conductive elements. By varying the spacing between adjacent conductive element portions it is therefore possible to produce EL lamps with extremely intricate brightness patterns. One possible application of such non-uniform lamps is in spelling out logos etc. In this application, one portion of the lamp (the portion spelling out the logo) contains approximately uniformly spaced conductive elements and the other portions of the lamp contains either a solid conductive layer or no conductive layer, both designs of which would emit no light. In another embodiment, in a single lamp, the spacing of adjacent portions of the conductive elements can be varied to provide the effect of shading.

We have discovered that the lamp brightness depends on the width 780 of the conductive elements and the width 790 of the channels separating these elements. We have found that it is preferred that the width 780 of the conductive elements is less than about 0.005 inches. In a more preferred embodiment, the width of the conductive elements is less than about 0.002 inches and in an even more preferred embodiment the width of the conductive elements is less than about 0.001 inches. It is preferred that the width 790 of the channels is less than about 0.005 inches. In a more preferred embodiment, the width of the channels is less than about 0.002 inches and in an even more preferred embodiment the width of the channels is less than about 0.001 inches.

The specific materials that may be used for the substrate, conductive elements, electroluminescent material, and optional dielectric layers depend on the fabrication method used to construct the lamps. If the lamps are fabricated using printing methods, the materials may be the same as previously described; however, when the lamps are fabricated using etching techniques different materials may be more suitable. These specific materials are discussed in the section below describing iso-planar lamp fabrication.

Without being bound by theory, we hypothesize that the iso-planar lamps of the present invention operate in the following manner. When two adjacent conductive elements are placed at the appropriate separation distance and power is supplied, an electric field gradient will be formed between and in the vicinity of the two conductive elements. The electroluminescent material that is positioned between and close to the conductive elements will emit light as a function of that gradient. Electroluminescent particles that are located closer to the electrode (where the electric field is stronger) will produce more light. Over time, these close proximity particles will wear out first. If the intensity of the electrical signal that drives the lamp is increased, the field strength will increase and particles that are farther away from the conductive elements may be caused to emit more light. This feature may allow the lamp's performance to be continuously adjusted over time. As particles close to the conductive elements begin to decay, fresh, unused particles may be accessed by simple control of the power supplied to the lamp.

Iso-planar Lamps: Including Translucent Electrode

Figure 12:
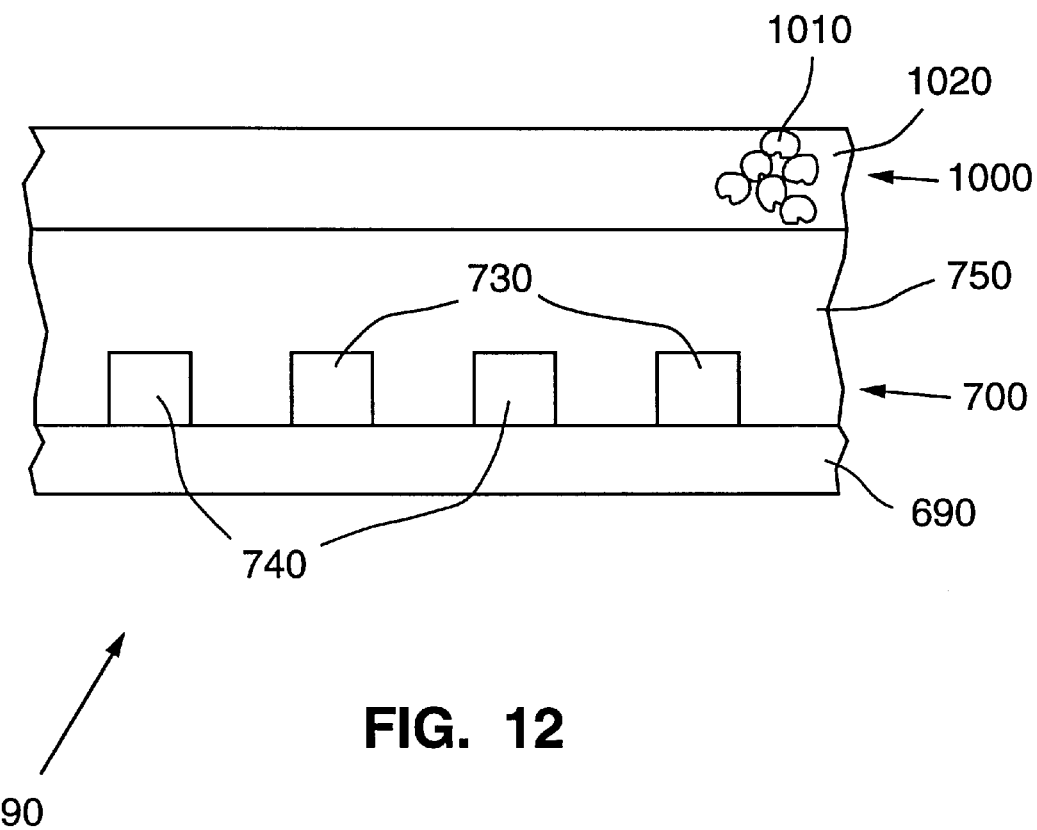
FIG. 12 shows a cross-sectional view of a portion of an electroluminescent lamp according to the present invention.

FIG. 12 shows an embodiment of the invention 990 that includes a substrate 690, an electrically conductive layer 700 divided into electrically conductive elements 730 and 740, an electroluminescent material 750, and a translucent or transparent electrically conductive material 1000 deposited over the electroluminescent material. The translucent or transparent electrically conductive material 1000 may generally be made of any material that is translucent or transparent to the light generated in the electroluminescent material and that is conductive. In the present invention, it is preferred that the translucent or transparent electrically conductive material is made of particles of translucent or transparent conductive material 1010 suspended in a matrix 1020. The particles of translucent or transparent conductive material may generally be made of any translucent or transparent conductive material; for example, particles of indium tin oxide may be used. The matrix may generally be any material capable of suspending the particles of translucent or transparent conductive material. As in the case of the printed laminar lamps, the matrix may be a flexible or deformable matrix which allows for the manufacture of flexible and vacuum formable lamps. The matrix used may be as previously described. Preferred materials include DuPont #7160 and Acheson DB2320 and SS-24823. In a preferred embodiment the translucent or transparent electrically conductive material has a thickness of about 0.001 inches.

Fabrication of Iso-planar Lamps

Generally, any method capable of fabricating the electrically conductive elements with the required spacings and geometries described above may be used for making the iso-planar lamps of the present invention; there are, however, two preferred methods of fabricating our iso-planar lamps: printing and etching, and we describe these methods in this section. Other suitable fabrication methods may include laser etching and heat stamping.

Printing Techniques for Making Iso-planar Lamps

The iso-planar lamps of the present invention may be fabricated using the following printing methods. First, the electrically conductive layer comprising the insulated conductive elements is printed on at least a portion of a substrate using a suitable printing method. After the first conductive layer has been printed, an electroluminescent material is deposited on at least a portion of the first electrically conductive layer at least partially filling a portion of one of the channels between the conductive elements. The iso-planar lamps may also include an optional protective dielectric layer covering the electroluminescent material and this layer may be deposited on the electroluminescent material after it has been deposited.

Suitable printing methods include any method capable of printing the electrically conductive layer with the required pattern and geometry. Preferred printing methods include screen and off-set printing. Other suitable printing methods are the same as those described in the fabrication of the laminar style lamps. Suitable materials for printing the electrically conductive layer are the same as described in the printing of the laminar lamps of the present invention.

As with the laminar lamps of the present invention, the iso-planar EL lamps may be printed onto almost any type of substrate material, i.e., paper, plastic, wood, fabrics, cardboard, etc. Preferred substrates are the same as described in detail in the previous sections.

In the iso-planar lamps of the present invention, the importance of the uniform thickness of the electroluminescent material is eliminated because in the new iso-planar lamp design it is the distance separation between adjacent segments of the iso-planar electrically conductive elements rather than the thickness of the electroluminescent material that is the main controlling factor of the light emitting properties of the lamp. When the electroluminescent material is deposited, the lamp's electrically conductive elements are already in place and their separation distance is fixed. All that is required, therefore, of the electroluminescent material printing step is to at least partially fill in or print the electroluminescent material into the channel or channels separating the conductive elements or to at least partially cover a portion of the conductive elements.

The conductive element spacing (which controls the lamp's electric field strength and therefore the lamp's output brightness) is easily controllable by changing the pattern of conductive material that is printed in the first printing step. For example, if the lamps are screen printed, it is easy to change the screen artwork to change the spacing and geometry of the electrically conductive elements. A lower performing lamp would only require a slightly different electrically conductive element structure which is easily realized by changing the screen. Printing methods other than screen printing (eg, offset, lithography etc.) may also be used to fabricate this type of iso-planar EL lamp because the material properties that affect the fabrication of screen printed laminar structures are eliminated. For instance, offset printing may not be feasible with phosphor inks because the phosphor particle's size is too large to allow for printing a uniform 0.002 inch thick layer. The lamps of the present invention, however, may be offset printed and may be produced in a roll and sheet fed process and production efficiency of these lamps is greatly increased with concomitant cost savings.

FIG. 13 shows another suitable method for fabricating iso-planar lamps of the present invention using printing techniques. FIG. 13A shows a cross-section of a partially complete lamp 920 fabricated using the direct printing techniques described above. FIG. 13A shows electrically conductive elements 730 and 740 which are substantially hemi-spherical in cross-section. By comparing the brightness of the lamps fabricated using simple printing and etching techniques (see next section), we believe that lamps that include conductive elements with non-smooth cross-sections may have the brightest output. Without being bound by theory, we hypothesize that this effect is due to the increased electric fields that are present close to the sharp edges of charged objects. Lamps that include conductive elements that have a cross-sectional radius of curvature that is less than half their width should therefore have increased light output. To enable printing of lamps with such non-smooth cross-sectional conductive elements, we have discovered the following new printing method shown in FIGS. 13B–13D.

Figure 13A:
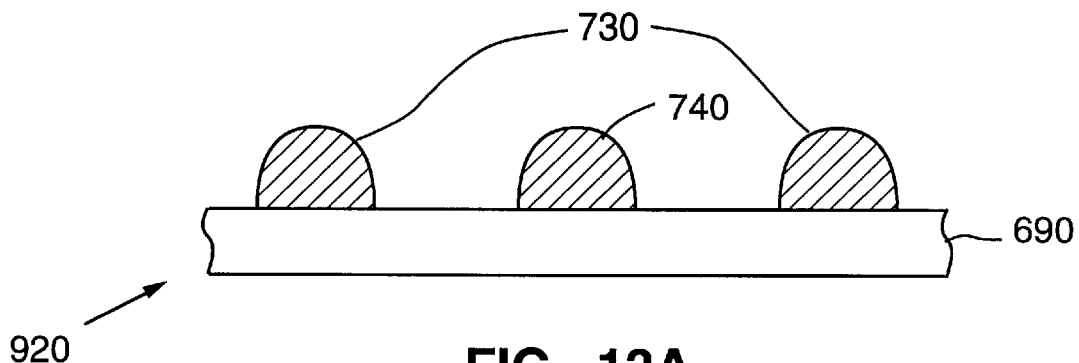
FIG. 13A shows a cross-sectional view of a portion of an electroluminescent lamp in an intermediate stage of manufacture by a process according to the present invention.
Figure 13B:
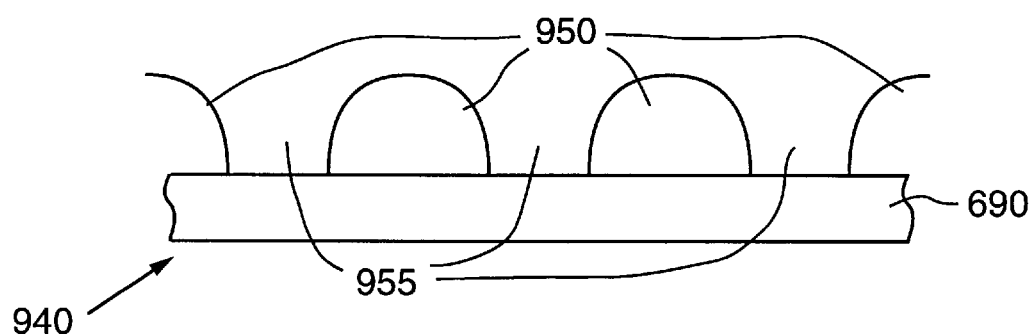
FIGS. 13B–13D show cross-sectional views of a portion of an electroluminescent lamp in three stages of manufacture by a process according to the present invention.
Figure 13C:
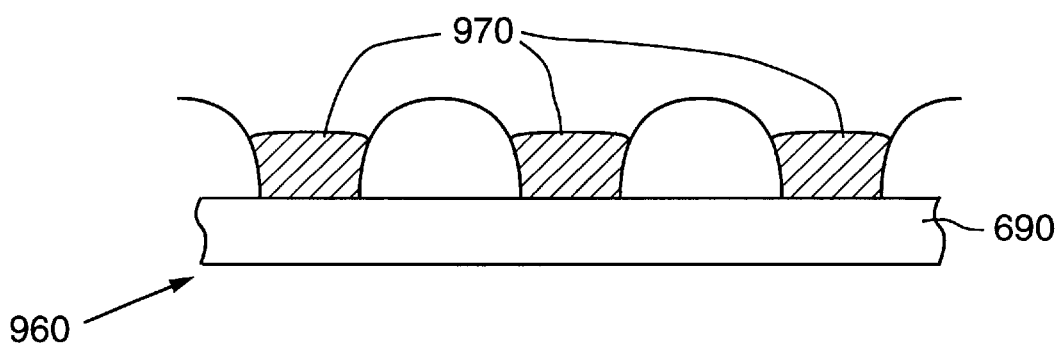
Figure 13D:
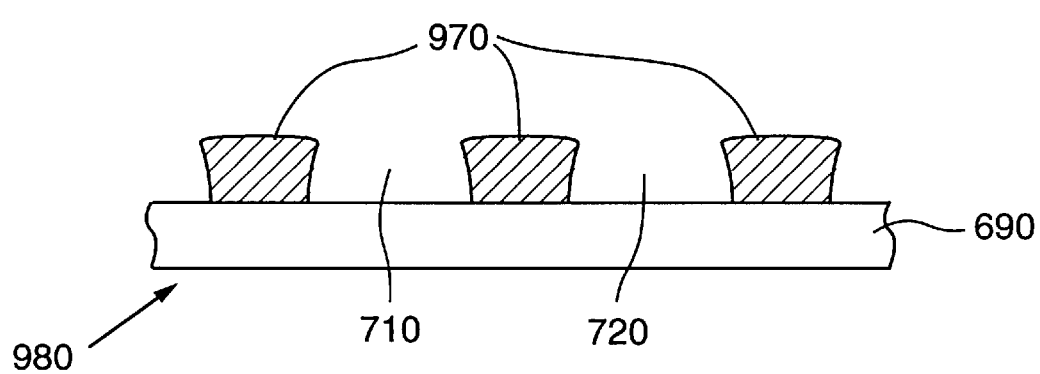

FIG. 13B shows a lamp 940 in the first stage of this method in which a removable material 950 is deposited on a substrate 690 in a pattern such that the channels 955 between the removable material are positioned approximately where the electrically conductive elements in the final lamp are required. FIG. 13C shows a lamp 960 in the next stage of manufacture in which a conductive material 970 is deposited in the volumes between the areas of removable material. The conductive material may be deposited using any suitable method; for example, it may be deposited using printing techniques or may be deposited using a squeegee, ink jet printer, plotter, or spray painting techniques. After the conductive material is deposited, the removable material is removed to leave the finished conductive elements that have a non-smooth cross section. FIG. 13D shows a lamp 980 in this state of completion and the lamp includes conductive elements 970 separated by channels 710 and 720. The lamp 980 may now be completed as described at the beginning of this section.

Regarding the materials that may be used for the removable material 950: Generally, any material that may define volumes 955 to be filled by the conductive material and that may be subsequently removed may be used. Examples of suitable materials include removable inks such as soya-oil based inks.

Regarding materials that may be used for the conductive material 970: Generally, any material that may be deposited in the volumes 955 and that is conductive may be used. In the present invention, preferred materials include conductive inks such as those described above. Depending on the removable material 950 and conductive material 970 used, the removable material may be removed by simple heating or may be removed by dissolving in a suitable solvent.

In an alternative embodiment, the removable material is replaced with an electroluminescent material that is not removed after the conductive elements have been deposited. Using this method, the conductive elements are fabricated with a cross-section similar to those shown in FIG. 13D but this method does not require the first printed material to be removed and does not require the subsequent deposit of electroluminescent material between the conductive elements. The lamp may be completed by depositing a layer of electroluminescent material over the already deposited electroluminescent material and conductive material. This final step may not be necessary.

It may also be possible to fabricate the iso-planar lamps of the present invention by printing catalytic ink in the pattern of the electrically conductive elements and then depositing a conductive metal on the catalytic ink via electroless plating. This catalytic ink process is described in U.S. Pat. No. 5,403,649, which is incorporated herein by reference.

Etching Techniques for Making Iso-planar Lamps

We have discovered that extremely bright iso-planar lamps may be fabricated using etching techniques. Generally, in this method a conductive layer is etched to produce the electrically conductive elements separated by channels and the lamp is then completed by depositing a layer of electroluminescent material over the etched conductive elements. FIGS. 14A through 14G show an etched iso-planar lamp in various stages of completion using a preferred photolithographic etching method.

Figure 14A:
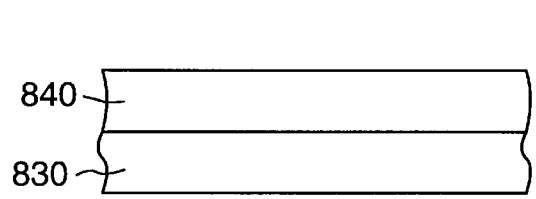
FIGS. 14A–14G show cross-sectional views of a portion of an electroluminescent lamp at various stages of manufacture by a process according to the present invention.
Figure 14B:
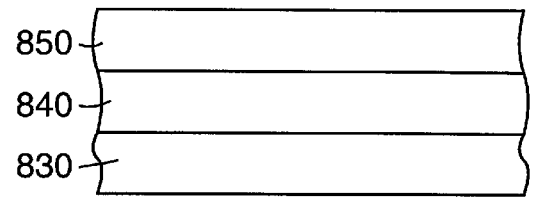
Figure 14C:
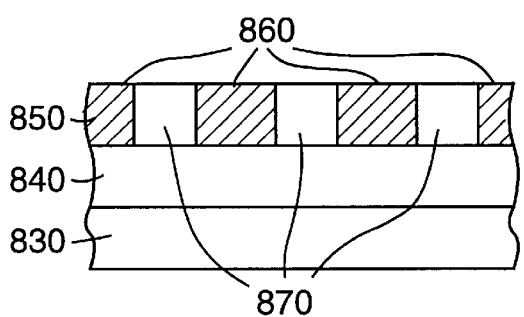
Figure 14D:
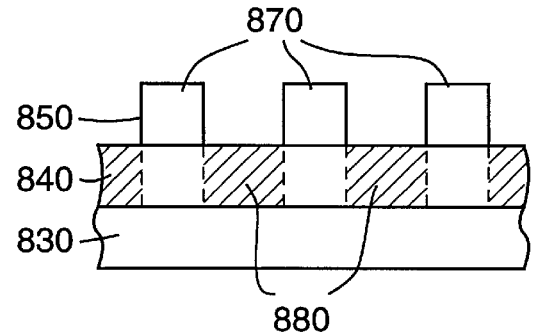
Figure 14E:
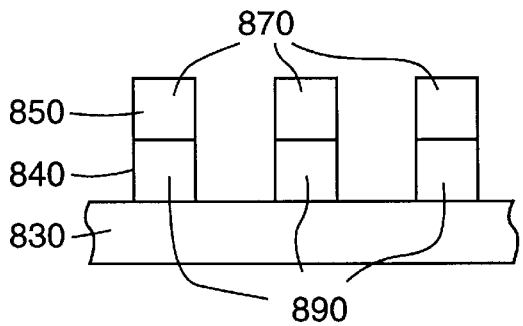
Figure 14F:
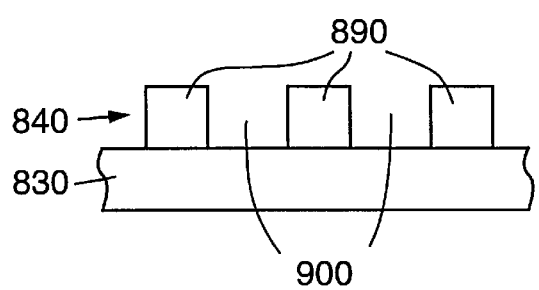
Figure 14G:
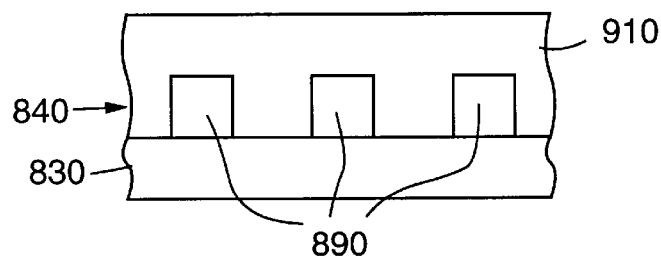

FIG. 14A shows a lamp in the first stage of completion in which the lamp includes a substrate 830 supporting a conductive layer 840. In the next stage of the process, a photosensitive layer 850 is deposited on the conductive layer 840 (see FIG. 14B). Next a mask is used to image a pattern on to the photosensitive material and this changes the solubility or reactivity of the exposed areas of the photosensitive material to a solvent. FIG. 14C shows a lamp after the photosensitive material has been exposed and the photosensitive layer includes exposed 860 and unexposed 870 portions. The next step is to remove either the exposed or unexposed portions of the photosensitive material by dissolving them in the selected solvent. FIG. 14D shows the lamp after removal of the exposed potion of the photosensitive material exposing portions 880 of the underlying conductive layer. The pattern imaged onto the photosensitive material is chosen so that the underlying conductive layer is exposed where the channels are required in the finished lamp. Next, the exposed conductive material 880 is removed by any suitable means (see FIG. 14E). For example, the exposed conductive material may be dissolved in a solvent which dissolves the conductive material but does not dissolve the remaining photosensitive material. Once the exposed conductive material 880 has been removed the remaining photosensitive material 870 is removed leaving the partially completed lamp that includes the electrically conductive elements 890 separated by channels 900 (see FIG. 14F). FIG. 14G shows the completed lamp after the electroluminescent material 910 has been deposited on the conductive elements 890.

Regarding the materials that may be used for the conductive layer 840: Generally, any electrically conductive material that can be etched into the required shaped electrically conductive elements may be used. In the present invention, it is preferred that the conductive layer 840 is made of electrically conductive metals such as copper. In a preferred embodiment the electrically conductive layer is an annealed copper layer.

When the electrically conductive layer is a metallic layer, the materials and processing conditions that may be used for etching the lamps of the present invention are well known in the art.

After the conductive elements have been fabricated, the electroluminescent material and any optional dielectric layers may be applied as described in detail above. In the present invention, the preferred electroluminescent material is DuPont # 7151 and the preferred dielectric material is DuPont # 5018.

The substrate 830 is optional and may not be required for proper functioning of the lamp. If the substrate is present, it may generally be made of any material capable of supporting the conductive layer 840. The substrate may be translucent or transparent to the light generated in the electroluminescent material 910 in which case the lamp may emit light from both sides. In a preferred embodiment of the invention, the substrate 830 and conductive layer 840 are made of a thin composite comprising a base layer of polyimide (e.g. "Kapton" sold by DuPont) over which an adhesive is applied which secures a layer of annealed copper to the base. Typically, the polyimide layer is about 0.001 inch thick, the adhesive is about 0.001 inch thick, and the annealed copper layer is about 0.0007 inch thick. Such composites are commercially available and commonly used in the preparation of printed circuit boards and flexible circuits. In this preferred embodiment, a key feature of the starting materials is the conductive copper layer, from which, according to the method of the invention, very detailed electrically conductive elements necessary for operation of the EL lamp can be created.

While the etching process has been described primarily with respect to photolithographic process as applied to a flexible substrate, those skilled in the art will understand that the process is ultimately useful with any substrate and with other methods of forming the copper (or other adequately conductive material) conductive element layout. While we prefer to use flexible substrate, the method is equally applicable to non-flexible materials, so long as the desired conductive element configuration can be created. An important feature of both the etching and printing methods of fabricating our iso-planar lamps is that these methods permit the conductive elements to be laid out in very precise fashion. The etching method is particularly well suited to fabricating iso-planar lamps with intricate conductive element geometry.

Electronics Used to Drive the Laminar and Iso-planar Lamps of the Present Invention The EL lamps described in this application may be driven using standard electronics used to drive EL lamps and may also be driven using the unique electronics described in U.S. patent application Ser. No. 08/698,973, filed Aug. 16, 1996, titled "Microprocessor Controller for Powering Electroluminescent Displays," which is incorporated herein by reference.

As described in the background section above, EL lamps of the present invention may be driven at higher frequency and with larger voltage than the conventional sputtered ITO/PET based lamps. The EL lamps of the present invention my be driven at a high enough voltage so that there is no audible "hum" from the lamp. Also, driving the lamps at a higher voltage produces a brighter lamp and may also produce a lamp capable of emitting U.V. radiation.

Using the printing and etching methods for both the laminar style and iso-planar lamps, the electronic circuitry for driving/controlling the lamp may be simultaneously fabricated with the lamps. Such a structure can save significant labor and material costs and provides for an integrated and simplified structure. FIG. 15 shows a lamp of the present invention including integrated driving circuitry. In this embodiment, the lamp unit 1030 includes an EL lamp 1040 printed or etched according to the present invention attached to an integrated driving circuit 1050 via conductive traces 1055. The driving circuit may include components such as IC controller 1060, resistors 1070, capacitors 1080, transformer 1090, diode 1100, and transistor 1110.

Figure 15A:
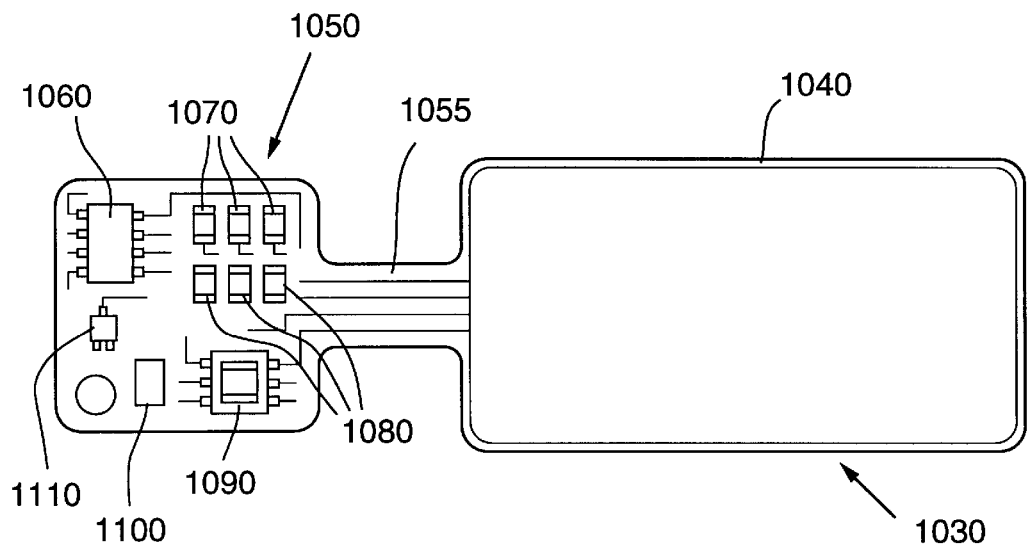
FIG. 15A shows a top plan view and FIG. 15B shows a cross-sectional view of an electroluminescent lamp and power circuit according to the present invention.
Figure 15B:
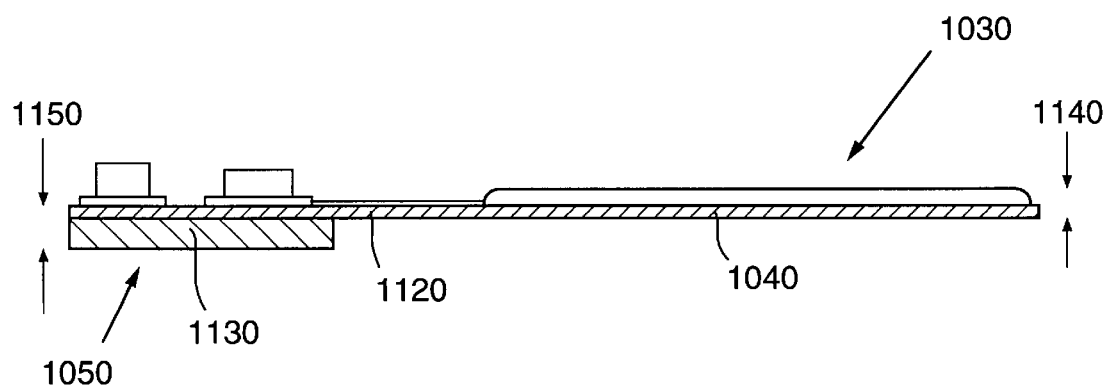

To fabricate lamps according to this aspect of the invention, the traces necessary for the driving and controller circuitry are designed into, and created during, the printing or etching processes described above. This permits the necessary devices such as an IC controller and associated resistors, capacitors, transformers and the like to be mounted as shown in FIG. 15A. The circuitry used for driving EL lamps, and which could be included on the lamp of the invention is known in the art. A unique circuit for driving and controlling EL lamps is described in our co-assigned patent application Ser. No. 08/698,973. It may sometimes be advantageous to include a backing stiffener 1130 behind the substrate on at least the portion of the lamp/driver combination on which devices for controlling and driving the lamps are mounted as shown in FIG. 15B. Typically the lamp thickness 1140 is about 0.005 inches and the backing stiffener thicknesses is about 0.045 inches, and the overall device is therefore very compact.

Experimental Results

Laminar Style Lamps of the Present Invention

FIGS. 16A through 16E show cross-sectional views of portions of laminar style lamps that have been manufactured according to the present invention. These lamps include a substrate 1160 (made of PET), printable translucent or transparent electrically conductive material 1170 (Acheson # DB 2320 or SS 24823), a first electrically conductive layer in the form of a grid 1180 (DuPont Silver Ink # 5025), an electroluminescent material 1190 (mixture of DuPont # 7155, Osram Sylvania 30, Rhodamine), a dielectric material 1200 (DuPont #7153 or 5018), a second electrically conductive layer 1210 (DuPont # 5025), and a dielectric sealing layer 1220 (DuPont # 5018). The lamps in FIGS. 16B, 16C and 16D also include a further dielectric layer 1230 (DuPont #5018).

Brightness of Laminar Style Lamps

Laminar style lamps were constructed that included the following layers printed on a polyester substrate: (1) translucent or transparent electrically conductive material (Acheson # DB 2320); (2) a first electrically conductive layer in the form of a grid (DuPont # 5025); (3) an electroluminescent layer (DuPont # 7151); (4) a dielectric layer (DuPont # 5018); (5) a second electrically conductive layer (DuPont # 5025); and (6) a dielectric sealing layer (DuPont # 5018). The lamps were bonded to power connections using Z-conductive tape from 3M. The lamps were driven at a range of frequencies and voltages and the following luminances (in fL) were measured:

|  | 50 V | 70 V | 90 V | 100 V | 120 V |
| --- | --- | --- | --- | --- | --- |
| 1500 Hz | 18 | 33 | 48 | 56 | 75 |
| 2500 Hz | 20 | 42 | 63 | 75 | 100 |

For comparison, the luminance of a commercially available electroluminescent lamp from Seikosha (the brightest EL lamp we have found that is commercially available) is about 75 fL measured at 120V and 1500 Hz.

Printed Iso-planar Lamps

An iso-planar EL lamp with helical shaped conductive elements (see FIG. 11C) was prepared.

Silver ink (DuPont #5025) was screen printed as a layer (approx. 0.0002 inches) onto a polyester film substrate (0.005 inches) so as to form the conductive elements in a circular shape. Subsequently, phosphor composition was applied over the electrodes by screen printing (Osram Sylvania type 60 green emitting) with the purpose of introducing phosphor between the conductive elements, and in the same plane as the conductive elements.

Electrical connections to the conductive elements were made in the form of pads which were printed along the periphery of the circular shaped lamp. Alligator clip connections were used to connect a nine volt power supply via a DC to AC converter (approx. 400 Hz). The disk shaped lamp produced a green light.

Additional lamps were produced where the evenly spaced conductive elements were formed in parallel lines (rather than spiral). The lamps were powered as described above and produced a uniform green light.

Etched Iso-planar Lamps

A flexible iso-planar EL lamp was prepared from a base layer comprising 0.0007 inch thick annealed copper attached to 0.001 inch thick polyimide (e.g. "Kapton" sold by DuPont) by a 0.001 inch thick layer of adhesive. Upon application of power the lamp produced a constant luminescent output. Line spacings (i.e., channel widths) for this lamp are about 0.0002 inches and trace widths (i.e., conductive element widths) are about 0.0002 inches. An inverted AC power supply was used and the lamp produced light at voltages in the range from about 35 to about 265 volts at 900 Hz. The lamp may produce light at voltages outside of this range. Brightness was observed to increase as voltage was increased. At 265 volts and 900 Hz the lamp produces a cool blue light which can be maintained for hours without visible decay of brightness. The lamp surface remains cool to the touch. At 15,000 Hz and 265 volts the lamp produces a more purple light but continues to operate cool. At 22,000 Hz. and 265 volts the lamp continues to operate cool and emits an even more purple colored light.

For comparison, a standard sputtered ITO laminar EL lamp (supplied by Leading Edge) was operated at 900 Hz and 265 volts. The lamp surface began to warm immediately, indicating the onset of thermal breakdown of the lamp. The power supply was then adjusted to deliver 265 volts at 2,500 Hz. Application of this power source to the standard ITO lamp resulted in breakdown and shorting out of the lamp. When a standard ITO layered lamp was operated at 130 volts, the lamp shorted out when the frequency was increased to about 6,000 Hz.

It is expected that a lamp according to the present invention with 0.0002 inch trace spacing and 0.0001 inch trace width will operate at standard EL operating conditions (e.g. 110 volts and 500–1000 Hz), while providing better brightness and significantly improved lamp half life compared to the standard EL lamps.

COMPARATIVE EXAMPLES

Figure 16A:
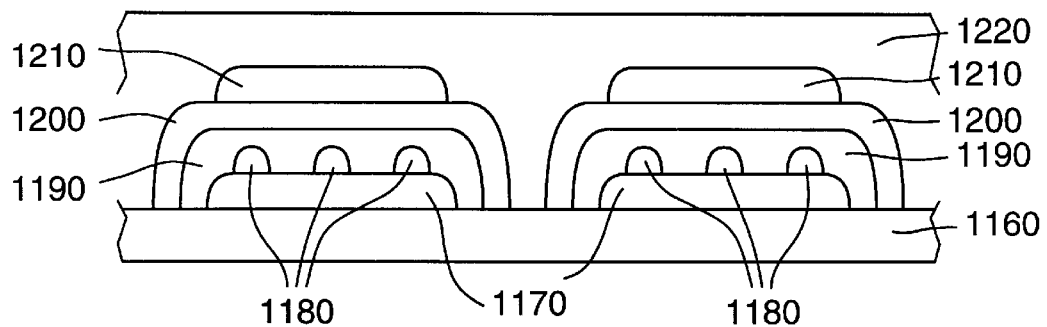
FIGS. 16A–16E show cross-sectional views of specific embodiments of electroluminescent lamps according to the present invention.
Figure 16B:
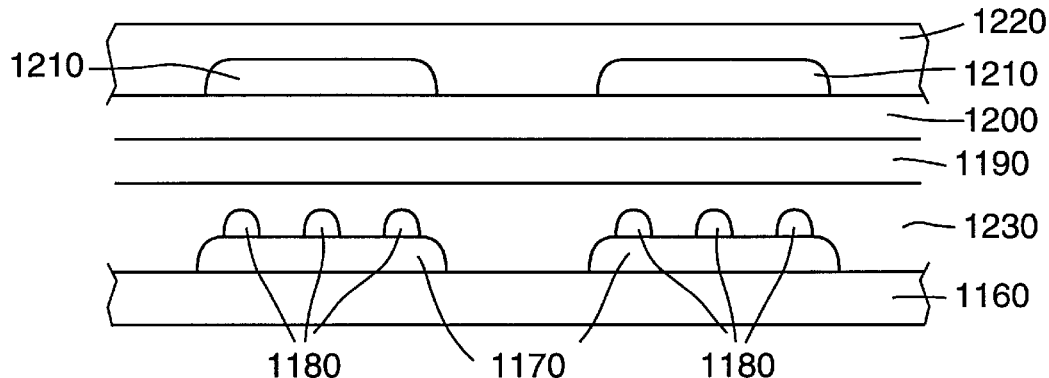
Figure 16C:
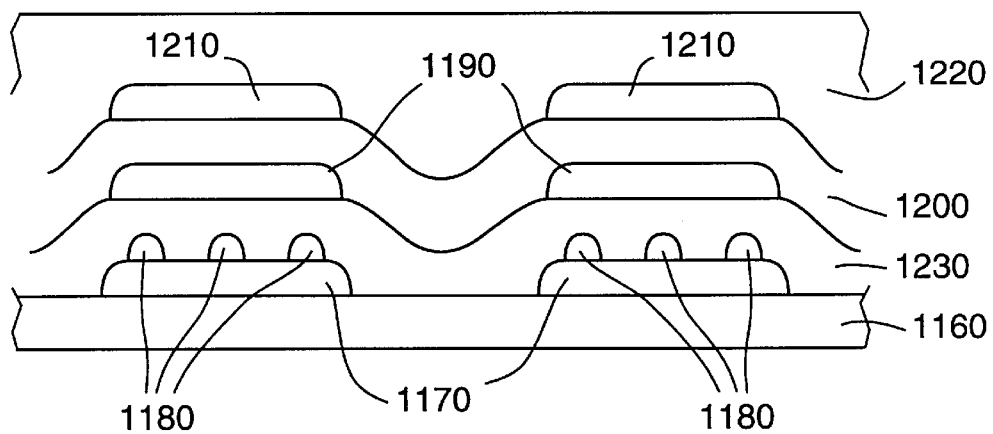
Figure 16D:
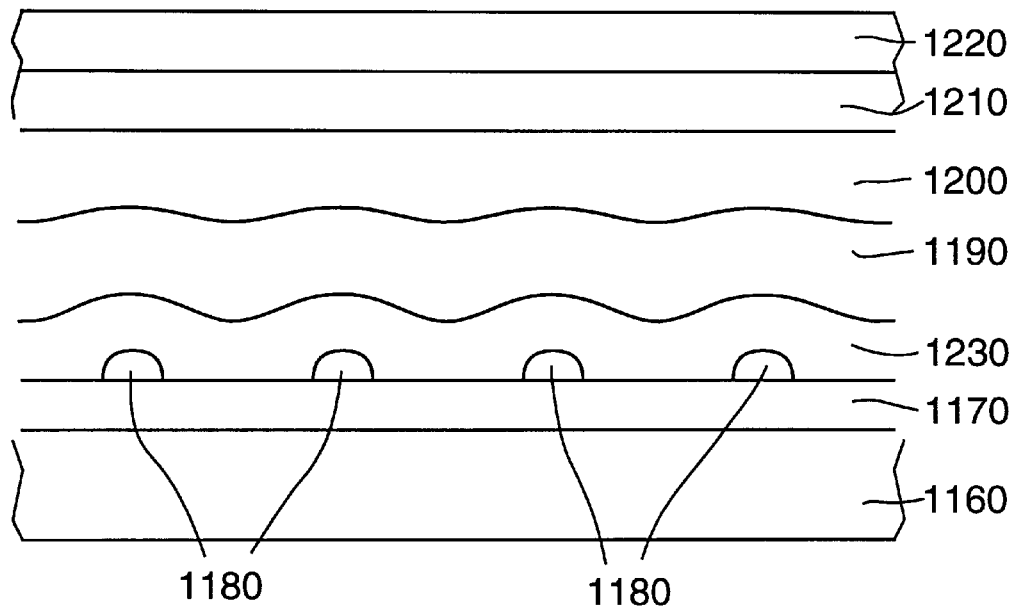
Figure 16E:
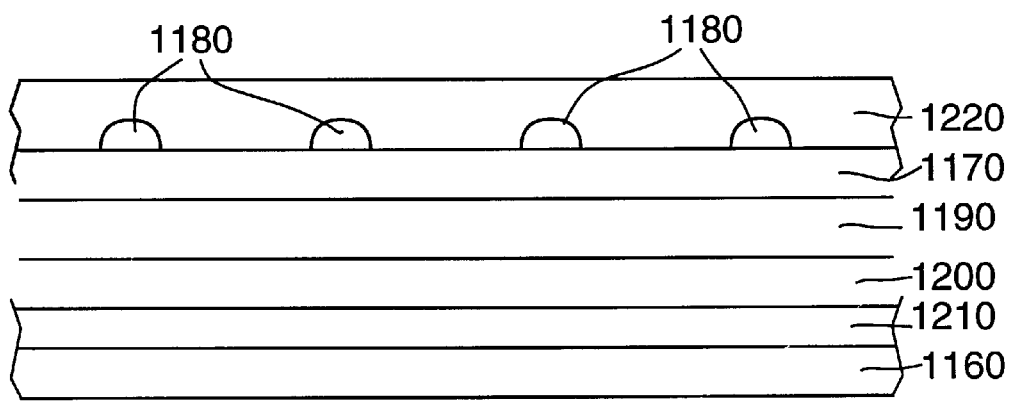

The following 1 inch square lamps were fabricated:

(1) a "reference" lamp based on the standard sputtered ITO electrode design (referred to as the "Reference" lamp);

(2) two laminar style lamps according to the present invention with the structure shown in FIG. 16D (referred to as the "Sandwich 1" and "Sandwich 2" lamps);

(3) a laminar style lamp according to the present invention with the structure shown in FIG. 16E (referred to as the "Inverted" lamp);

(4) a laminar style lamp with the structure shown in FIG. 16D except the lamp did not contain the first electrically conductive layer 1180 (referred to as the "ITO only" lamp); and (5) an iso-planar style lamp according to the present invention with the etched copper structure described above and with a channel width of about 0.002 inches and a conductive element width of about 0.002 inches (referred to as the "Copper 2/2" lamp).

In the lamps based on the structures shown in FIGS. 16D and 16E, the first conductive layer was printed in the form of an approximately square mesh with openings of side approximately 0.018 inches and with conductive element widths of less than about 0.006 inches. Lamps containing the square mesh first conductive layer are collectively referred to as "Reinforced" lamps.

Table I shows the results of relative luminance measurements on the lamps described above for driving voltages of 110 and 220 V, and for driving frequencies of 400, 1000, and 5000 Hz.

| Sample Structure | Relative Luminance | | | | | |
|---|---|---|---|---|---|---|
| | 110 Vrms | | | 220 Vrms | | |
| | 400 Hz | 1 kHz | 5 kHz | 400 Hz | 1 kHz | 5 kHz |
| Reference | 1.0 | 1.2 | 1.7 | 4.0 | 6.3 | 11.0 |
| Sandwich 1 | 0.7 | 0.8 | 0.5 | 2.2 | 3.1 | 0.8 |
| Sandwich 2 | 0.22 | 0.29 | 0.58 | 1.2 | 2.3 | 4.8 |
| Inverted | 0.5 | 0.7 | 1.1 | 3.0 | 5.0 | 9.0 |
| ITO only | 0.5 | 0.7 | 0.9 | 2.9 | 5.1 | 9.8 |
| Copper 2/2 | 0.6 | 1.0 | 1.8 | 4.5 | 7.9 | 14.7 |

The "ITO only" and "Reference" lamps do not contain the first conductive layer and when these lamps were compared to the "Reinforced", the difference in brightness distribution and temperature rise became obvious at frequencies above 2.5 kHz. The "ITO only" and "Reference" lamps developed darker areas in the middle of the 1"×1" squares at higher frequencies; in contrast, the "Reinforced" lamps maintained uniform brightness to the frequency limit of the power supply (above 20 kHz). The temperature of the "Reinforced" lamps raised inversely to the line width of the grid pattern. The thicker the line, the lower the temperature rise (but at the expense of luminance, as more light was blocked by the grid).

What is claimed is:

1. An electroluminescent lamp produced by a process comprising the steps of:

(a) providing a first electrically conductive layer that includes one or more channels dividing the first electrically conductive layer into two or more electrically conductive elements; and (b) depositing an electroluminescent material between or onto at least a portion of the electrically conductive elements;

wherein a portion of at least one of the conductive elements has a width of less than about 0.005 inches.

2. An electroluminescent lamp produced by the process described in claim 1, wherein the process further comprises the step of (c) depositing a translucent or transparent electrically conductive material onto at least a portion of the electroluminescent material.

3. An electroluminescent lamp produced by the process described in claim 2, wherein step (c) comprises the steps of (i) depositing a material comprising translucent or transparent electrically conductive particles suspended in a translucent or transparent curable matrix onto at least a portion of the electroluminescent material; and (ii) heating the translucent or transparent electrically conductive material to cure the matrix.

4. An electroluminescent lamp produced by the process described in claim 3, wherein the curable matrix comprises a material selected from the group consisting of polyesters, epoxies, and cellulose based resins.

5. An electroluminescent lamp produced by the process described in claim 3, wherein the translucent or transparent conductive particles comprise indium tin oxide.

6. An electroluminescent lamp produced by the process described in claim 1, wherein step (a) comprising the steps of:

(i) providing a conductive layer;
(ii) producing the first electrically conductive layer by dividing the conductive layer into two or more electrically conductive elements separated by one or more channels.

7. An electroluminescent lamp produced by the process described in claim 6, wherein in step (ii) the first electrically conductive layer is divided into two or more electrically conductive elements by chemically etching or heat stamping the one or more channels into the conductive layer.

8. An electroluminescent lamp produced by the process described in claim 7, wherein step (ii) includes the steps of:

($\alpha$) coating the conductive layer with a photosensitive material having a solubility in a solvent;
($\beta$) exposing a portion of the photosensitive material to electromagnetic radiation thereby changing the solubility of the exposed portion of the photosensitive material relative to the solubility of the unexposed portion;
($\gamma$) dissolving the more soluble portion of the photosensitive material in the solvent to expose a portion of the conductive layer;
($\delta$) removing the exposed portion of the conductive layer to form the one or more channels; and
($\epsilon$) removing the less soluble portion of the photosensitive material from the conductive layer.

9. An electroluminescent lamp produced by the process described in claim 6, wherein step the conductive layer is made of a conductive material comprising copper.

10. An electroluminescent lamp produced by the process described in claim 1, wherein step (a) includes the steps of:

(i) providing a substrate; and
(ii) depositing the first electrically conductive layer onto the substrate.

11. An electroluminescent lamp produced by the process described in claim 10, wherein in step (ii) the first electrically conductive layer is deposited onto the substrate using printing techniques.

12. An electroluminescent lamp produced by the process described in claim 11, wherein the first electrically conductive layer is deposited onto the substrate by screen or off-set printing.

13. An electroluminescent lamp produced by the process described in claim 10, wherein step (ii) comprises the steps of:

($\alpha$) depositing a removable material onto a portion of the substrate in a pattern that divides the substrate into at least two unconnected areas on which the removable material is not deposited;
($\delta$) depositing a conductive material onto at least a portion of the areas of the substrate on which the removable material is not deposited; and
($\gamma$) removing at least a portion of the removable material.

14. An electroluminescent lamp produced by the process described in claim 13, wherein the removable material is a removable ink and is deposited onto the substrate using printing techniques.

15. An electroluminescent lamp produced by the process described in claim 14, wherein the removable material is deposited onto the substrate by off-set printing.

16. An electroluminescent lamp produced by the process described in claim 13, wherein the conductive material comprises conductive particles suspended in a matrix and the conductive material is deposited onto the substrate using printing techniques.

17. An electroluminescent lamp produced by the process described in claim 1, wherein the process further comprises the step of permanently reshaping the electroluminescent lamp.

18. An electroluminescent lamp produced by the process described in claim 17, wherein step (a) of claim 1 includes the steps of:

(i) providing a deformable substrate; and
(ii) depositing a curable electrically conductive ink onto the substrate to form the first electrically conductive layer; and wherein the electroluminescent material comprises particles of electroluminescent material suspended in a curable matrix; and wherein the process further comprises the steps of permanently reshaping the electroluminescent lamp before the curable electrically conductive ink and curable matrix are totally cured and subsequently curing the curable electrically conductive ink and curable matrix.

19. An electroluminescent lamp produced by the process described in claim 18, wherein the curable electrically conductive ink and curable matrix are cured by heating.

20. An electroluminescent lamp produced by the process described in claim 1, wherein the process further comprises the step of:

(c) providing one or more electrically conductive traces connected to two or more of the electrically conductive elements.

21. An electroluminescent lamp produced by the process described in claim 20, wherein steps (a) and (c) are performed simultaneously.

22. An electroluminescent lamp produced by the process described in claim 21, wherein steps (a) and (c) comprise the steps of:

(i) providing a conductive layer;
(ii) producing the first electrically conductive layer and the one or more electrically conductive traces by dividing the conductive layer into two or more electrically conductive elements separated by one or more channels and into one or more electrically conductive traces.

23. An electroluminescent lamp produced by the process described in claim 21, wherein steps (a) and (c) comprises the steps of:

(i) providing a substrate; and
(ii) depositing the first electrically conductive layer and the one or more electrically conductive traces onto the substrate.

24. An electroluminescent lamp produced by the process described in claim 23, wherein in step (ii) the first electrically conductive layer and the one or more electrically conductive traces are deposited onto the substrate using printing techniques.

25. An electroluminescent lamp produced by the process described in claim 1, wherein at least a portion of the surface of one of the conductive elements has a radius of curvature that is less than half of the width of the conductive element.

26. An electroluminescent lamp produced by the process described in claim 1, wherein the electrically conductive elements each comprise a plurality of elongated conductive elements and wherein at least a portion of the elongated conductive elements have a width of between about 0.001 inches and about 0.005 inches and wherein at least a portion of the one or more channels has a width of between about 0.001 inches and about 0.005 inches.

27. An electroluminescent lamp produced by the process described in claim 26, wherein at least a portion of the elongated conductive elements have a width of about 0.002 inches and wherein at least a portion of the one or more channels has a width of about 0.002 inches.

28. An electroluminescent lamp produced by the process described in claim 27, wherein at least a portion of the elongated conductive elements have a height of between about 0.001 inches and about 0.05 inches.

29. An electroluminescent lamp produced by the process described in claim 28, wherein at least a portion of the elongated conductive elements have a height of between about 0.005 inches and about 0.01 inches.

30. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;
    (d) printing a second electrically conductive layer onto at least a portion of the electroluminescent material;
    wherein at least a portion of one of the electrically conductive layers includes one or more openings through the layer, the openings being separated by electrically conductive elements, wherein the openings have edges and at least one of the openings has a minimum edge to edge distance of less than about 0.005 inches.

31. An electroluminescent lamp produced by the process according to claim 30, wherein the shape of the openings is approximately square or hexagonal.

32. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;
    (d) printing a second electrically conductive layer onto at least a portion of the electroluminescent material;
    wherein at least a portion of one of the electrically conductive layers includes one or more openings through the layer, the openings being separated by electrically conductive elements, and wherein at least a portion of one of the electrically conductive elements has a width of less than about 0.002 inches.

33. An electroluminescent lamp according to claim 32 wherein at least a portion of one of the electrically conductive elements has a width of less than about 0.005 inches.

34. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;
    (d) printing a second electrically conductive layer onto at least a portion of the electroluminescent material;
    wherein at least a portion of one of the electrically conductive layers includes one or more openings through the layer, the openings being separated by electrically conductive elements, wherein the shape of the openings is approximately square and the length of a side of at least one of the openings is less than about 0.003 inches and at least a portion of one of the electrically conductive elements has a width of less than about 0.005 inches.

35. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;
    (d) printing a second electrically conductive layer onto at least a portion of the electroluminescent material;
    wherein at least a portion of both of the electrically conductive layers includes one or more openings through the layer, the openings being separated by electrically conductive elements.

36. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;
    (d) printing a second electrically conductive layer onto at least a portion of the electroluminescent material;
    wherein at least one of the electrically conductive layers is deposited in a pattern including a plurality of elongated electrically conductive elements separated by one or more channels and wherein at least a portion of one of the elongated electrically conductive elements has a width of less than about 0.005 inches.

37. An electroluminescent lamp produced by the process according to claim 36 wherein at least a portion of one of the elongated electrically conductive elements has a width of less than about 0.002 inches.

38. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;
    (d) printing a second electrically conductive layer onto at least a portion of the electroluminescent material;
    wherein at least one of the electrically conductive layers is deposited in a pattern including a plurality of elongated electrically conductive elements separated by one or more channels and wherein at least a portion of one of the channels has a width of less than about 0.005 inches.

39. An electroluminescent lamp produced by the process according to claim 38 wherein at least a portion of one of the channels has a width of less than about 0.002 inches.

40. An electroluminescent lamp produced by a process comprising the steps of:
    (a) providing a substrate;
    (b) printing a first electrically conductive layer onto at least a portion of the substrate;
    (c) depositing an electroluminescent material onto at least a portion of the first electrically conductive layer;

(d) printing a second electrically conductive layer onto at least a portion of the electroluminescent material;

wherein the substrate provided in step (a) includes a translucent or transparent electrically conductive material and in step (b) the first electrically conductive layer is printed onto at least a portion of the translucent or transparent electrically conductive material.

41. An electroluminescent lamp produced by the process according to claim 40, wherein the translucent or transparent electrically conductive material comprises translucent or transparent conducting particles suspended in a matrix.

42. An electroluminescent lamp produced by the process according to claim 41, wherein the translucent or transparent conducting particles comprise indium tin oxide.

\* \* \* \* \*